United States Patent
Sasaki et al.

(10) Patent No.: US 10,777,293 B2
(45) Date of Patent: Sep. 15, 2020

(54) SEMICONDUCTOR DEVICE, MEMORY TEST METHOD FOR SEMICONDUCTOR DEVICE, AND TEST PATTERN GENERATION PROGRAM

(71) Applicant: RENESAS ELECTRONICS CORPORATION, Tokyo (JP)

(72) Inventors: Tomonori Sasaki, Tokyo (JP); Tatsuya Saito, Tokyo (JP); Hideshi Maeno, Tokyo (JP); Takeshi Ueki, Tokyo (JP)

(73) Assignee: RENESAS ELECTRONICS CORPORATION, Tokyo (JP)

( * ) Notice: Subject to any disclaimer, the term of this patent is extended or adjusted under 35 U.S.C. 154(b) by 0 days.

(21) Appl. No.: 16/378,056

(22) Filed: Apr. 8, 2019

(65) Prior Publication Data
US 2019/0333598 A1  Oct. 31, 2019

(30) Foreign Application Priority Data

Apr. 27, 2018  (JP) ................. 2018-086397

(51) Int. Cl.
*G11C 29/26* (2006.01)
*G11C 29/56* (2006.01)
*G01R 31/3185* (2006.01)
*G11C 29/18* (2006.01)

(52) U.S. Cl.
CPC ...... *G11C 29/26* (2013.01); *G01R 31/318597* (2013.01); *G11C 29/56004* (2013.01); *G11C 2029/1806* (2013.01); *G11C 2029/5602* (2013.01)

(58) Field of Classification Search
CPC ............................................. G11C 2029/1806
See application file for complete search history.

(56) References Cited

U.S. PATENT DOCUMENTS

| | | | |
|---|---|---|---|
| 2005/0166026 A1* | 7/2005 | Ware ................. | G11C 29/02 711/167 |
| 2005/0193233 A1* | 9/2005 | Magliocco ......... | G11C 29/56004 714/5.1 |
| 2006/0200713 A1* | 9/2006 | Slobodnik ............ | G11C 29/18 714/718 |
| 2007/0162794 A1* | 7/2007 | Park ................. | G11C 29/56008 714/718 |
| 2015/0270015 A1* | 9/2015 | Murphy ............... | G11C 29/44 714/723 |

FOREIGN PATENT DOCUMENTS

JP     2012-234605 A    11/2012

* cited by examiner

*Primary Examiner* — Steve N Nguyen
(74) *Attorney, Agent, or Firm* — McDermott Will & Emery LLP

(57) ABSTRACT

To overcome a problem of increase of test time related to BIST in a conventional semiconductor device, a semiconductor device according to one embodiment includes a plurality of memory arrays having different sizes, a test pattern generation circuit that outputs a test pattern for the memory arrays, and a memory interface circuit that is provided for every memory array and converts an access address. The memory interface circuit shifts a test address output from the test pattern generation circuit in accordance with a shift amount set for every memory array, thereby converting the test address to an actual address of a memory array to be tested.

16 Claims, 21 Drawing Sheets

FIG. 10
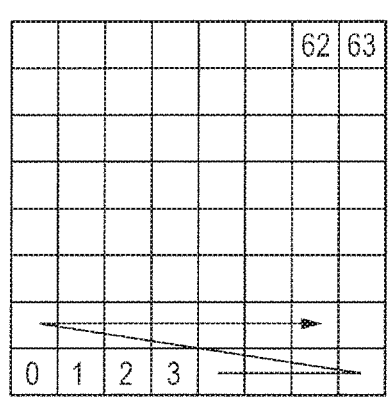
MEMORY A
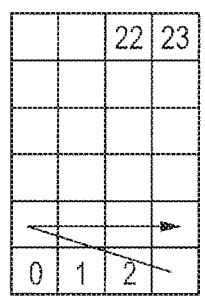
MEMORY B
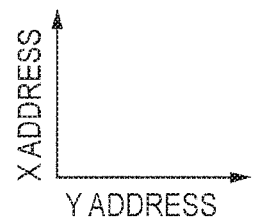
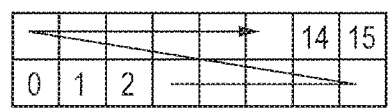
MEMORY C
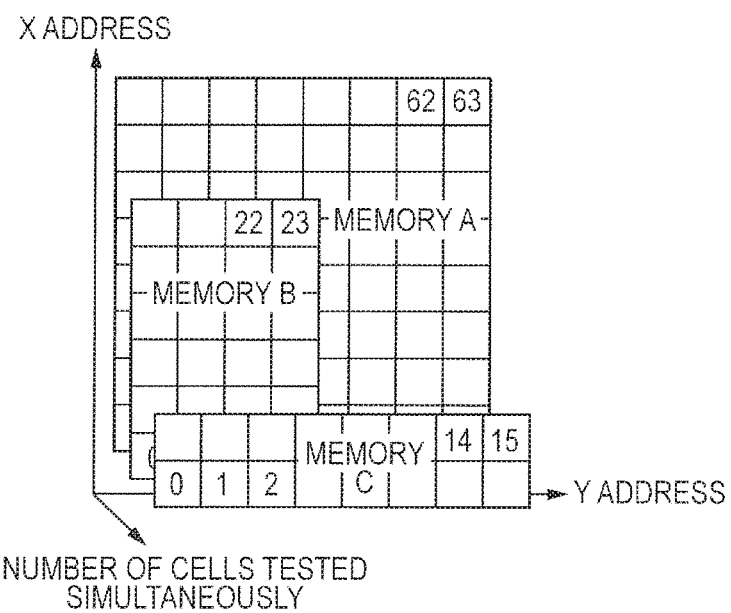

FIG. 11
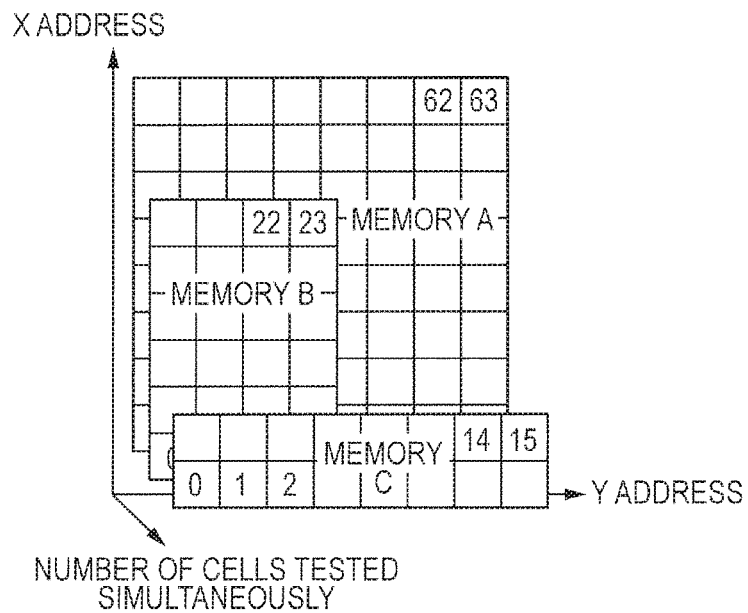
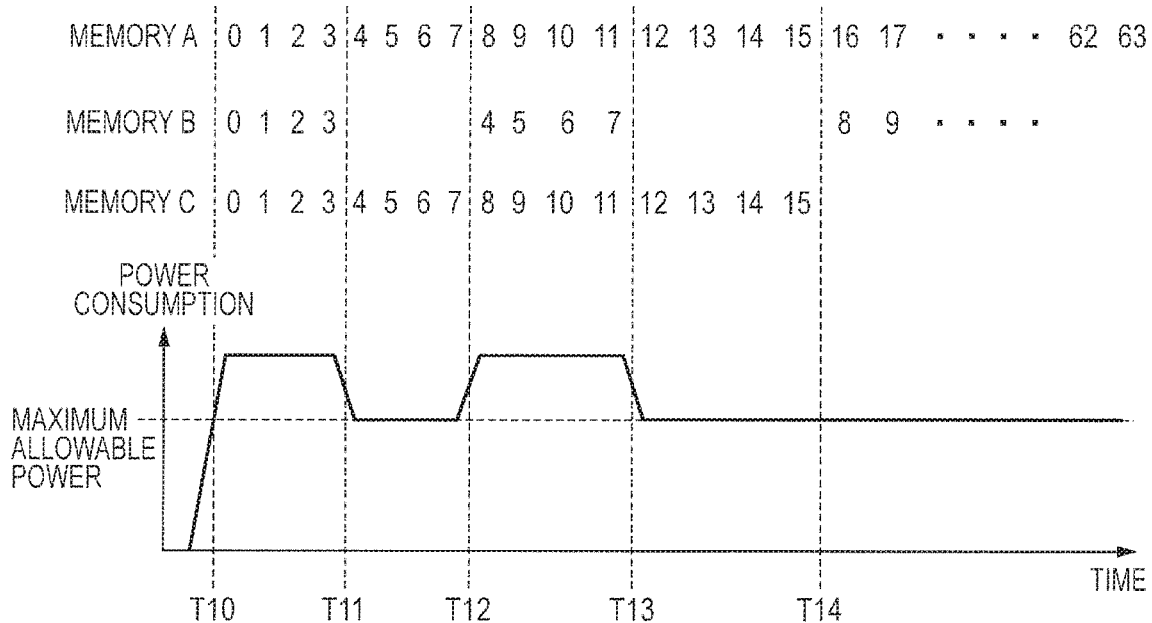

FIG. 12
FIRST EMBODIMENT
(WITH CONTROL OF TEST TIMING)
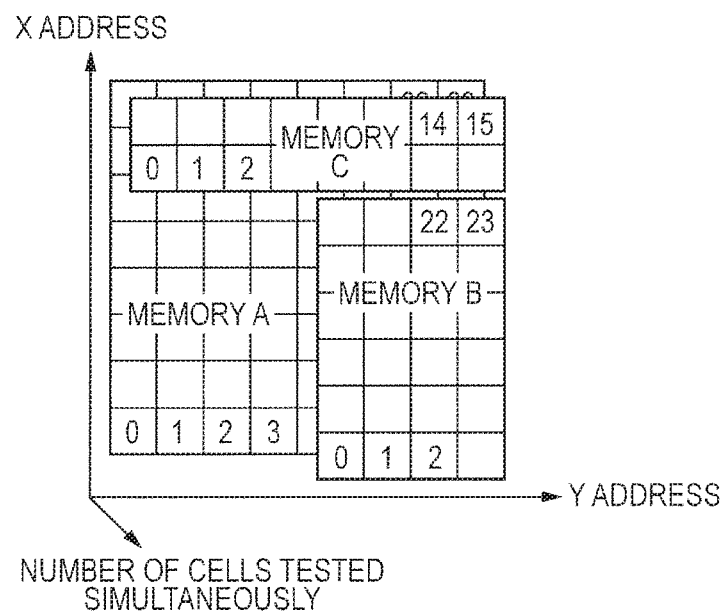
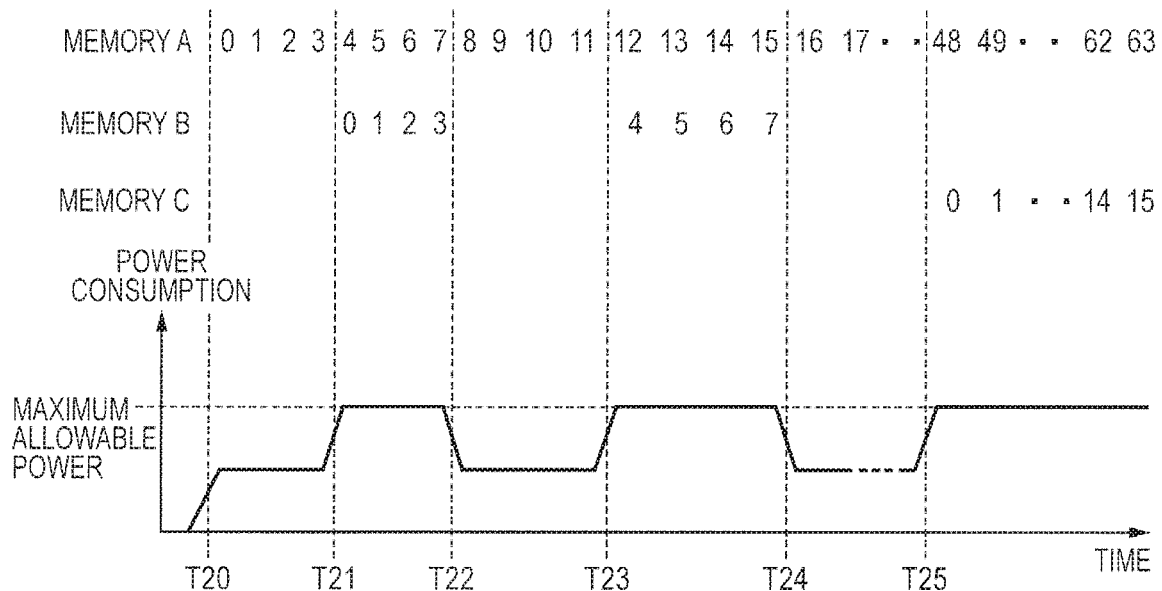

FIG. 14

TABLE SHOWING INPUT/OUTPUT OF ADDRESS SHIFTER ACCORDING TO SECOND EMBODIMENT

| SHIFT AMOUNT IN X DIRECTION | Xadd_MPG [2] [1] | Xadd_MPG [0] | X_OFF [1] [0] | Xadd_MEM [0:2] |
|---|---|---|---|---|
| 6 | 11 | 0, 1 | 00 | 000, 001 |
| | | | 01 | INVALID |
| | | | 10 | INVALID |
| | | | 11 | INVALID |
| 4 | 10 | 0, 1 | 00 | INVALID |
| | | | 01 | 000, 001 |
| | | | 10 | INVALID |
| | | | 11 | INVALID |
| 2 | 01 | 0, 1 | 00 | INVALID |
| | | | 01 | INVALID |
| | | | 10 | 000, 001 |
| | | | 11 | INVALID |
| 0 | 00 | 0, 1 | 00 | INVALID |
| | | | 01 | INVALID |
| | | | 10 | INVALID |
| | | | 11 | 000, 001 |

FIG. 15

| PROFILE NAME | FEATURE | MEMORY NAME | SHIFT AMOUNT |
|---|---|---|---|
| FIRST POWER PROFILE | POWER CONSUMPTION IS SMOOTHED | SRAM_1 | X_OFF=aa1, Y_OFF=bb1 |
| | | SRAM_2 | X_OFF=aa2, Y_OFF=bb2 |
| | | ... | X_OFF=aa3, Y_OFF=bb3 |
| | | SRAM_n | X_OFF=aa4, Y_OFF=bb4 |
| SECOND POWER PROFILE | POWER CONSUMPTION INCREASES IN LATTER HALF OF TEST | SRAM_1 | X_OFF=cc1, Y_OFF=dd1 |
| | | SRAM_2 | X_OFF=cc2, Y_OFF=dd2 |
| | | ... | X_OFF=cc3, Y_OFF=dd3 |
| | | SRAM_n | X_OFF=cc4, Y_OFF=dd4 |
| THIRD POWER PROFILE | POWER CONSUMPTION INCREASES IN FIRST HALF OF TEST | SRAM_1 | X_OFF=ee1, Y_OFF=ff1 |
| | | SRAM_2 | X_OFF=ee2, Y_OFF=ff2 |
| | | ... | X_OFF=ee3, Y_OFF=ff3 |
| | | SRAM_n | X_OFF=ee4, Y_OFF=ff4 |
| FOURTH POWER PROFILE | POWER CONSUMPTION EXCEEDS (OVERLOAD TEST) | SRAM_1 | X_OFF=gg1, Y_OFF=hh1 |
| | | SRAM_2 | X_OFF=gg2, Y_OFF=hh2 |
| | | ... | X_OFF=gg3, Y_OFF=hh3 |
| | | SRAM_n | X_OFF=gg4, Y_OFF=hh4 |

MACRO OF OFFSET STORAGE REGISTER

FIG. 21
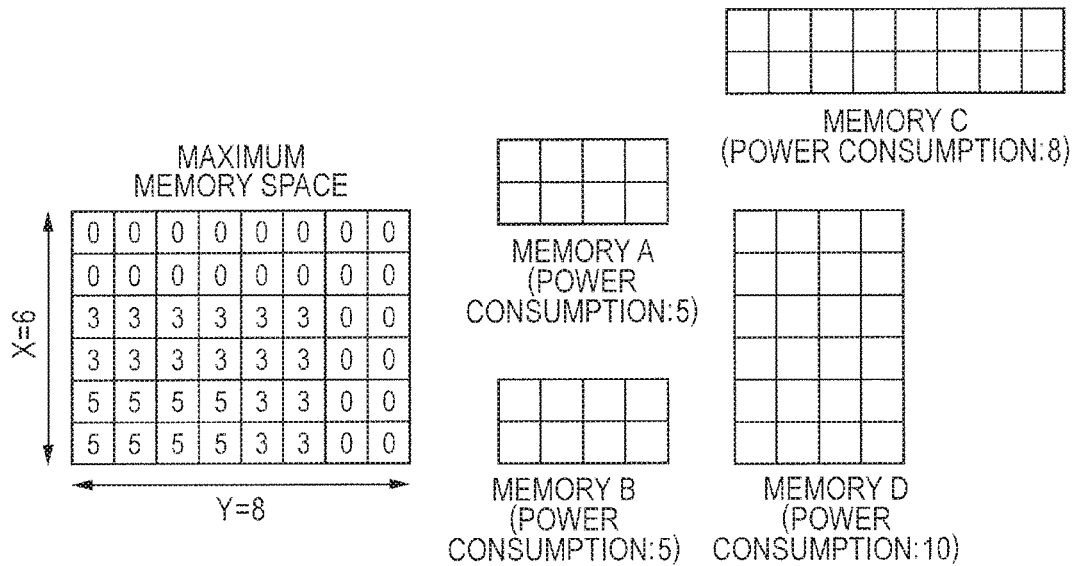
GROUP MEMORIES SO THAT
MEMORIES FIT WITHIN
MAXIMUM MEMORY SPACE
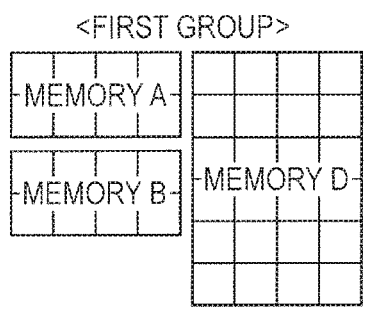
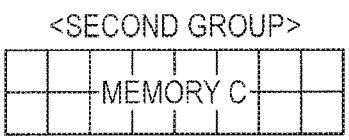
ADJUST OVERLAPPING
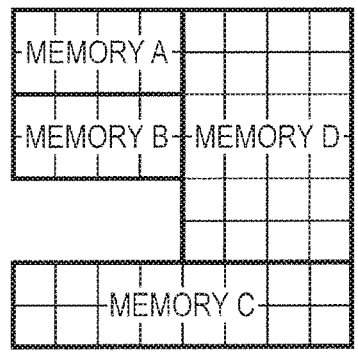

FIG. 22
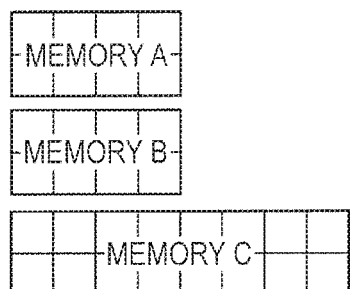
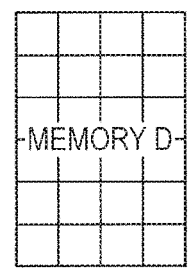
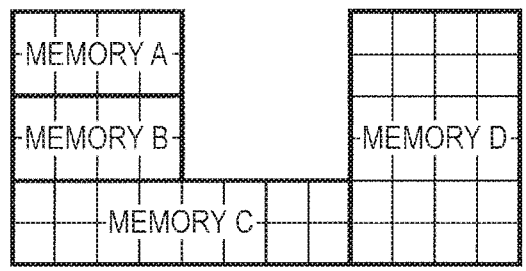
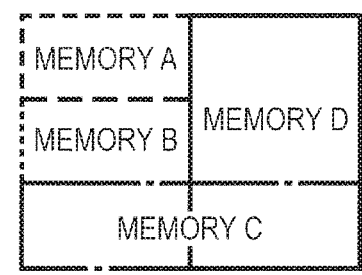
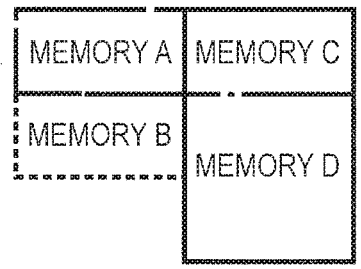
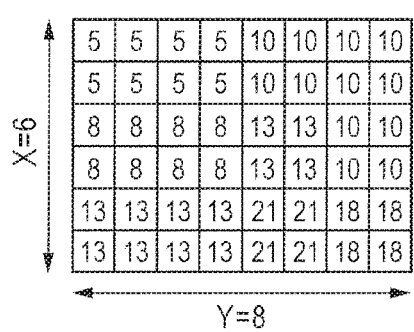
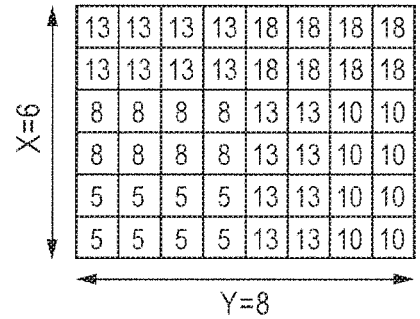

SEMICONDUCTOR DEVICE, MEMORY TEST METHOD FOR SEMICONDUCTOR DEVICE, AND TEST PATTERN GENERATION PROGRAM

CROSS-REFERENCE TO RELATED APPLICATIONS

The disclosure of Japanese Patent Application No. 2018-086397 filed on Apr. 27, 2018 including the specification, drawings and abstract is incorporated herein by reference in its entirety.

BACKGROUND

The present invention relates to a semiconductor device, a memory test method for a semiconductor device, and a test pattern generation program and, for example, relates to a semiconductor device having a memory BIST (Built-In Self-Test) function that performs a self test for an internal memory, a memory test method for the semiconductor device, and a test pattern generation program.

A semiconductor device including a memory has a function that detects a failure of the memory and performs a process of replacing a failure cell or a process of invalidating the failure cell to enable continuation of an operation as a system even when the failure occurs in the memory. To achieve this function, a semiconductor device including a memory incorporates a test circuit for testing the memory. An example of the semiconductor device including such a test circuit is disclosed in Japanese Unexamined Patent Application Publication No. 2012-234605.

The semiconductor device in Japanese Unexamined Patent Application Publication No. 2012-234605 includes a control circuit and first and second pattern generators. When both tests by the first and second test pattern generators are write, the control circuit permits execution of a test sequence by one of the test pattern generators and does not permit execution of a test sequence by the other test pattern generator, outputs a write test pattern from the one test pattern generator to a corresponding one of memory groups, shifts write execution for the other memory group in time by a unit of a write test cycle of the one memory group, permits execution of the test sequence by the other test pattern generator after writing for the one memory group by the one test pattern generator is finished, and outputs a write test pattern to the other memory group corresponding to the other test pattern generator.

SUMMARY

In the technique described in Japanese Unexamined Patent Application Publication No. 2012-234605, test timings of groups subjected to a memory test are shifted from each other, so that the number of memory cells simultaneously activated is reduced and power consumption during a test is reduced. However, the technique described in Japanese Unexamined Patent Application Publication No. 2012-234605 has a problem of increase of a test time. When the test time is increased, there arises a problem that a test cannot be finished within a defined test time or the test cost is increased because of increase of the test time.

Other objects and novel features will be apparent from the description of this specification and the accompanying drawings.

According to an embodiment, a semiconductor device includes a plurality of memory arrays having different sizes, a test pattern generation circuit that outputs a test pattern for the memory arrays, and a memory interface circuit that converts an access address provided for every memory array. The memory interface circuit shifts a test address output from the test pattern generation circuit in accordance with a shift amount set for every memory array to convert the test address to an actual address of a memory array to be tested.

According to the aforementioned embodiment, the semiconductor device can suppress a test time and can set the magnitude of the power consumption during a test in any manner.

BRIEF DESCRIPTION OF THE DRAWINGS

FIG. 10 illustrates an example of a memory array to be tested in the semiconductor device according to the first embodiment.

FIG. 11 illustrates a memory test in the semiconductor device according to the first embodiment when a memory interface circuit is not used.

FIG. 12 illustrates a memory test in the semiconductor device according to the first embodiment when a memory interface circuit is used.

FIG. 14 illustrate input and output values of the address shifter according to the second embodiment in form of a table.

FIG. 15 illustrates an example of a power profile set for the semiconductor device according to a third embodiment in form of a table.

FIG. 21 is a diagram for detailed explanation of a method of determining an offset value in the semiconductor device according to the fifth embodiment.

FIG. 22 is a diagram for detailed explanation of the method of determining an offset value in the semiconductor device according to the fifth embodiment.

DETAILED DESCRIPTION

Figure 1:
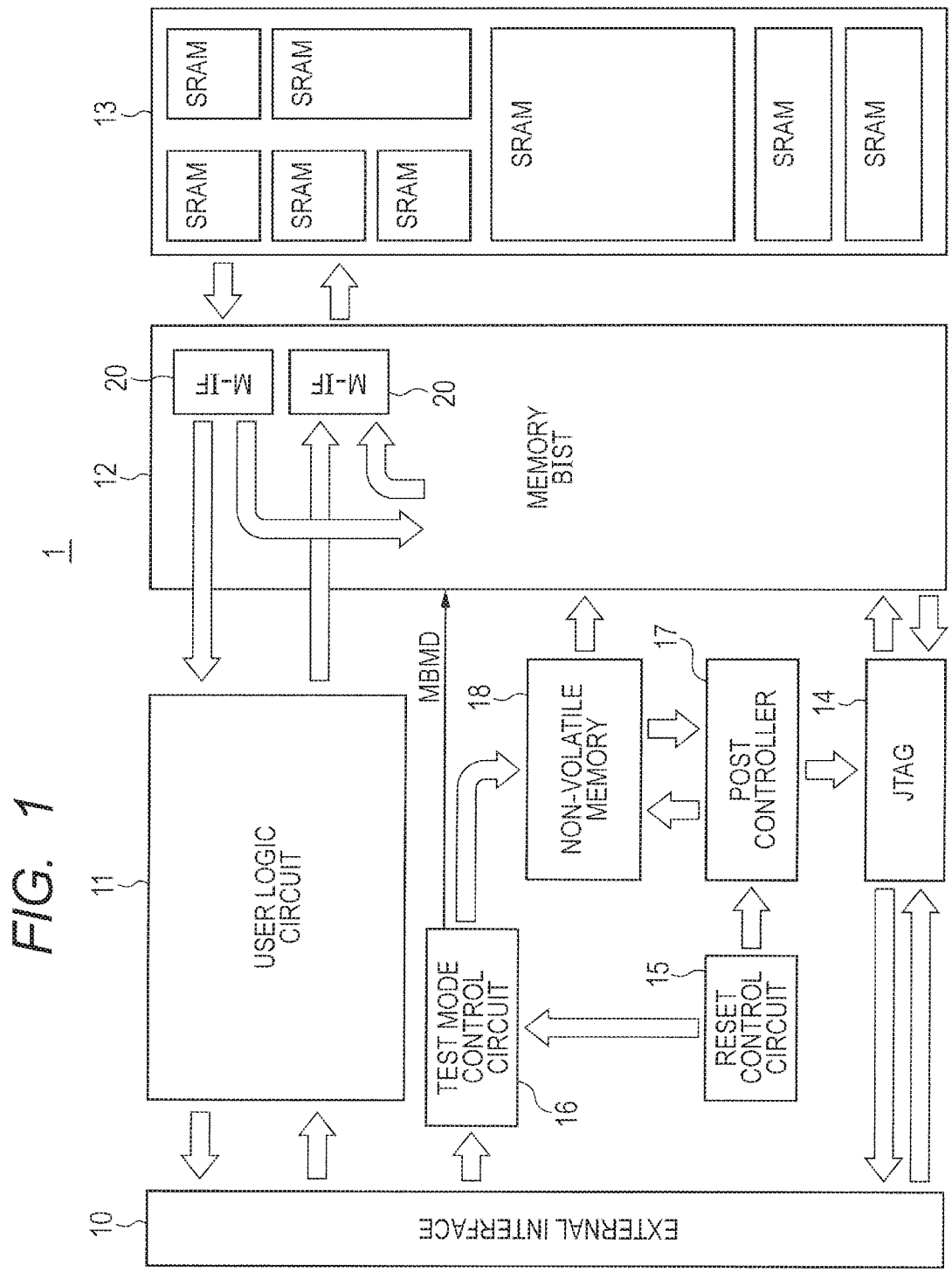
FIG. 1 is a block diagram of a semiconductor device according to a first embodiment.

For clarifying explanation, omission and simplification are made in the following description and the drawings as appropriate. Each of elements illustrated in the drawings as functional blocks performing various processes can be configured by a CPU (Central Processing Unit), a memory, or another circuit if being achieved by hardware, and can be implemented by a program loaded to a memory if being implemented by software. Therefore, a person skilled in the art would understand that these functional blocks can be implemented by hardware only, software only, or a combination of hardware and software in various ways, and implementation is not limited to any of them. Throughout the drawings, the same element is labeled with the same reference sign, and redundant description is omitted as necessary.

The above-described program can be stored in various types of non-transitory computer-readable media to be supplied to a computer. The non-transitory computer-readable media include various types of tangible recording media. Examples of the non-transitory computer-readable medium include a magnetic recording medium (for example, a flexible disk, a magnetic tape, and a hard disk drive), a magneto-optical recording medium (for example, a magneto-optical disk), a CD-ROM (Read Only Memory), a CD-R, a CD-R/W, and a semiconductor memory (for example, a mask ROM, a PROM (Programmable ROM), an EPROM (Erasable ROM), a flash ROM, and a RAM (Random Access Memory)). Also, the program may be supplied to the computer by various types transitory computer-readable media. Examples of the transitory computer-readable medium include an electric signal, an optical signal, and an electromagnetic wave. The transitory computer-readable medium can supply the program to the computer via a wired communication path, such as an electric wire and an optical fiber, or a wireless communication path.

FIG. 1 is a block diagram of a semiconductor device 1 according to a first embodiment. As illustrated in FIG. 1, the semiconductor device 1 according to the first embodiment includes an external interface circuit 10, a user logic circuit 11, a memory BIST circuit 12, an internal memory 13, a JTAG (Joint Test Action Group) controller 14, a reset control circuit 15, a test mode control circuit 16, a post (Power On Self-Test) controller 17, and a non-volatile memory 18.

The external interface circuit 10 is an interface circuit that transmits and receives a signal between the inside of the semiconductor device 1 and the outside of the semiconductor device 1. The user logic circuit 11 is a logic circuit designed in accordance with a request by a user or an operation circuit that executes a program introduced by the user. The user logic circuit 11 achieves a function that is achieved on the basis of the logic circuit or the program, while using the internal memory 13. That is, the user logic circuit 11 outputs access addresses for a plurality of memory arrays to perform a process that uses the memory arrays.

The memory BIST circuit 12 is a circuit for testing the internal memory 13. The memory BIST circuit 12 mediates transmission and reception of a signal between the user logic circuit 11 and the internal memory 13 in a normal operation mode in which the user logic circuit 11 uses the internal memory 13. Meanwhile, in a test operation mode in which the internal memory 13 is tested, the memory BIST circuit 12 receives a test condition setting value as a test program from the JTAG controller 14 or the non-volatile memory 18, and tests the internal memory 13 by using a test pattern (for example, an address signal, write data, or a memory control signal) generated from a pattern generator included in the memory BIST circuit 12. Further, the memory BIST circuit 12 is instructed whether to operate in the normal operation mode or in the test operation mode by a test mode control signal MBMD output from the test mode control circuit 16.

The internal memory 13 is a storage device including a plurality of memory arrays. For example, each memory array is a volatile memory, such as an SRAM (Static Random Access Memory). In the example illustrated in FIG. 1, every memory array is denoted with reference sign "SRAM". It is assumed that the memory arrays of the semiconductor device 1 according to the first embodiment include memory arrays that are different from each other in the number of memory cells arranged in a grid. That is, the memory arrays are different from each other in the memory storage capacity.

The JTAG controller 14 sets a test pattern including an address-shift setting pattern in a shift register in the memory BIST circuit 12 by a method that sets a test mode in a circuit by using a state operation defined in IEEE (Institute of Electrical and Electronics Engineers). The address-shift setting pattern is a pattern unique to the memory BIST circuit 12 according to the first embodiment, and the details will be described later. That is, it is assumed that the test pattern used in the semiconductor device 1 according to the first embodiment includes at least information on a test address indicating a test sequence during a test, write data to be written to a memory array during the test, an expected value corresponding to the write data, and the address-shift setting pattern.

The reset control circuit 15 detects turning on of the semiconductor device 1 and generates a reset signal, or generates a reset signal on the basis of a reset signal input to the semiconductor device 1. The test mode control circuit 16 outputs the test mode control signal MBMD that switches the normal operation mode in which the user logic circuit 11 uses the memory arrays and the test operation mode in which the memory arrays are tested. The test mode control circuit 16 also supplies information, for example, a test pattern stored in the non-volatile memory 18, to the memory BIST circuit 12 on the basis of an instruction supplied via the external interface circuit 10. The POST controller 17 is a sequencer that performs a power-on self-test to be performed before a system including the semiconductor device 1 is booted, in response to a test signal output from the reset control circuit 15. For example, the non-volatile memory 18 is a non-volatile memory, such as a flash memory. In the non-volatile memory 18 is stored a test pattern that includes an address-shift setting pattern to be used in the memory BIST circuit, for example.

The semiconductor device 1 according to the first embodiment includes the JTAG controller 14, the reset control circuit 15, the test mode control circuit 16, the POST controller 17, and the non-volatile memory 18 for the memory BIST circuit 12. Therefore, a manner of supplying a test pattern to the memory BIST circuit 12 has a plurality of modes. For example, four modes of a manner of supplying a test pattern are available in the semiconductor device 1 according to the first embodiment. The following description is provided for examples of the manner of supplying a test pattern in the semiconductor device 1 according to the first embodiment.

Figure 2:
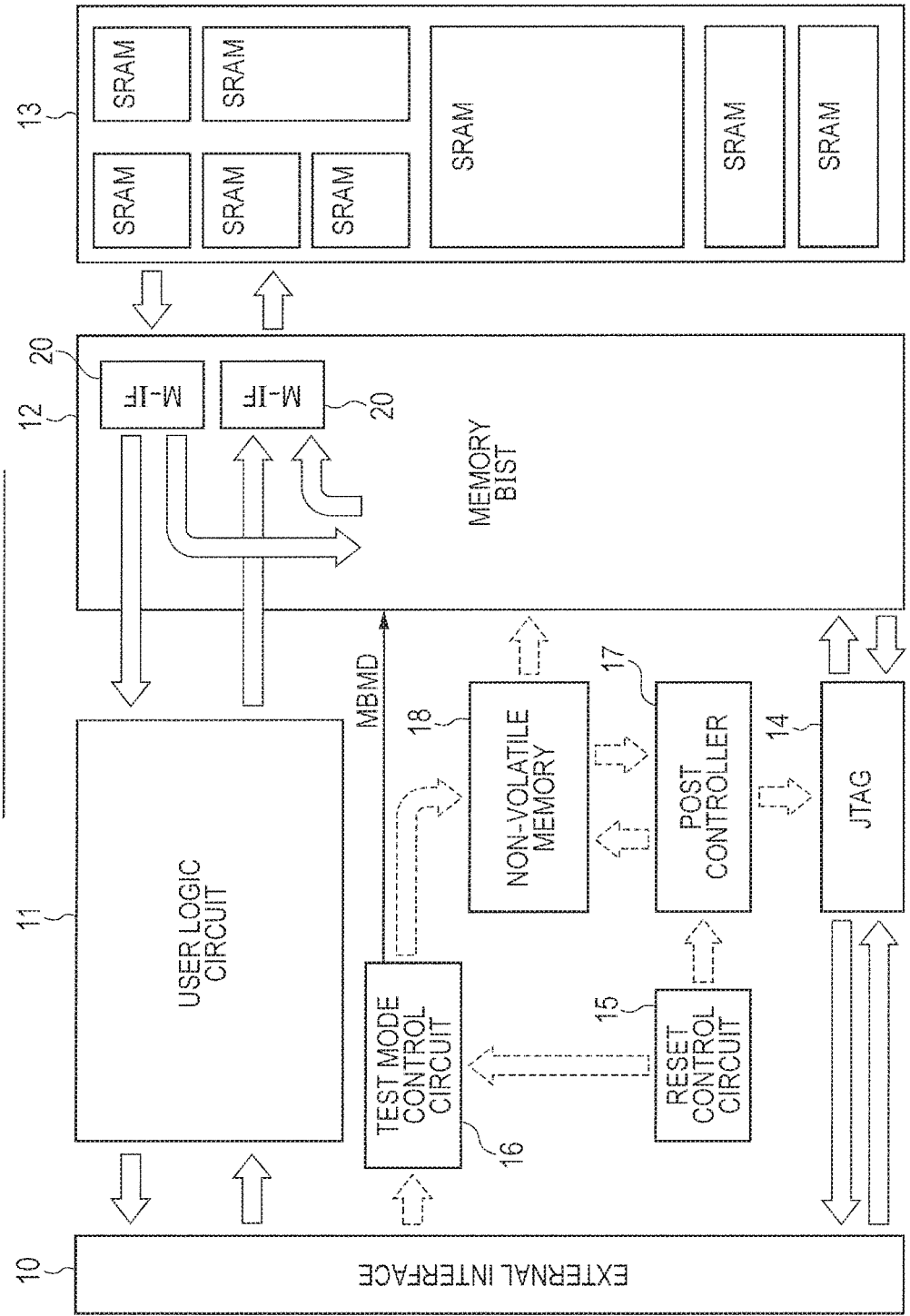
FIG. 2 is a block diagram of the semiconductor device according to the first embodiment, illustrating a first example of a supply path of a test pattern.

FIG. 2 is a block diagram of the semiconductor device according to the first embodiment, illustrating a first example (for example, a first test operation mode) of a supply path of a test pattern. In the first example, the JTAG controller 14 is controlled from the outside via the external interface circuit 10. Then, a test pattern is set in the memory BIST circuit 12 by using the JTAG controller 14 in the first example.

Figure 3:
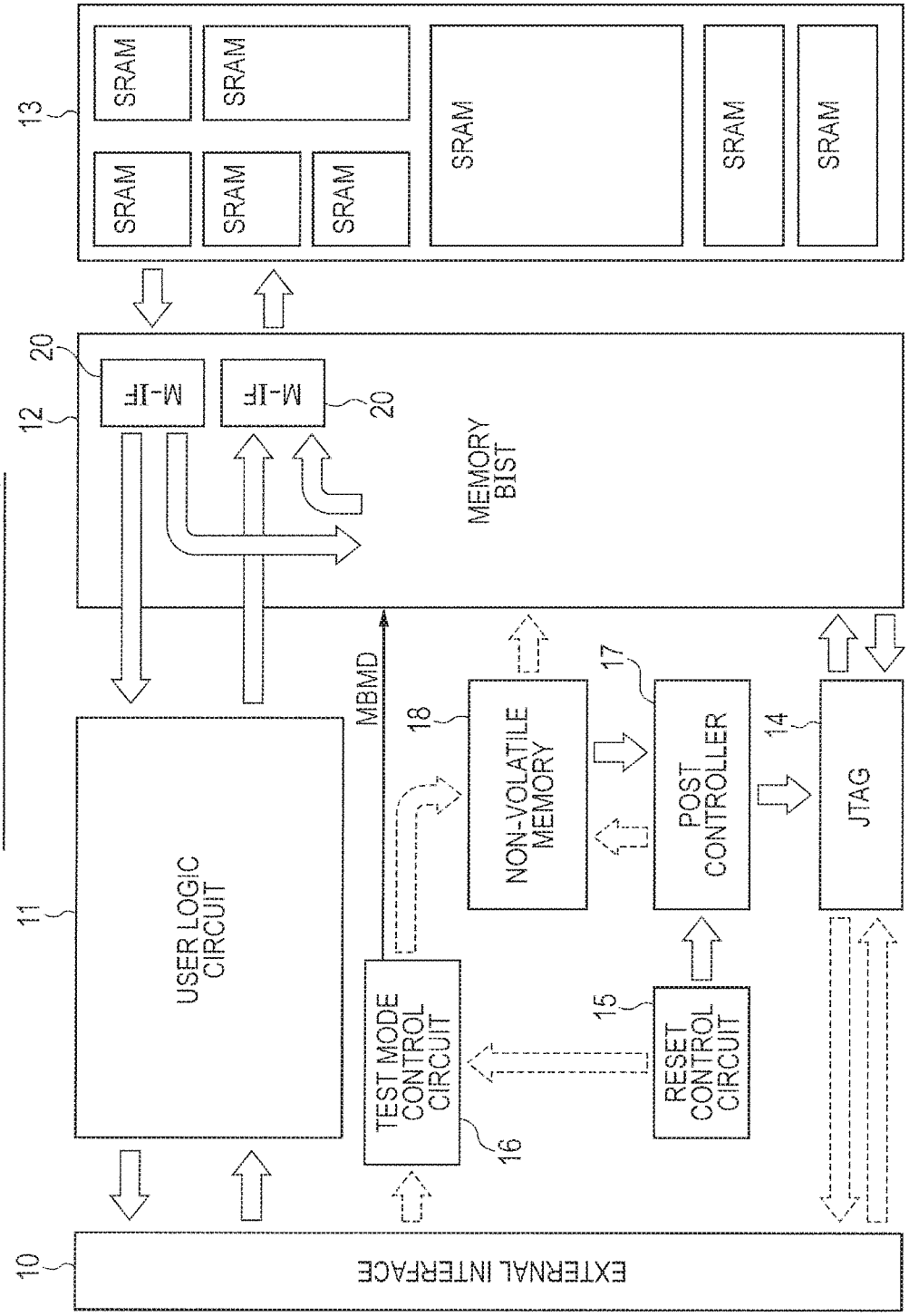
FIG. 3 is a block diagram of the semiconductor device according to the first embodiment, illustrating a second example of the supply path of a test pattern.

FIG. 3 is a block diagram of the semiconductor device according to the first embodiment, illustrating a second example (a second test operation mode) of a supply path of a test pattern. In the second example, the POST controller 17 is caused to operate in response to output of a reset signal by the reset control circuit 15. At this time, the POST controller 17 supplies a test pattern stored in the non-volatile memory 18 to the memory BIST circuit 12 via the JTAG controller 14.

Figure 4:
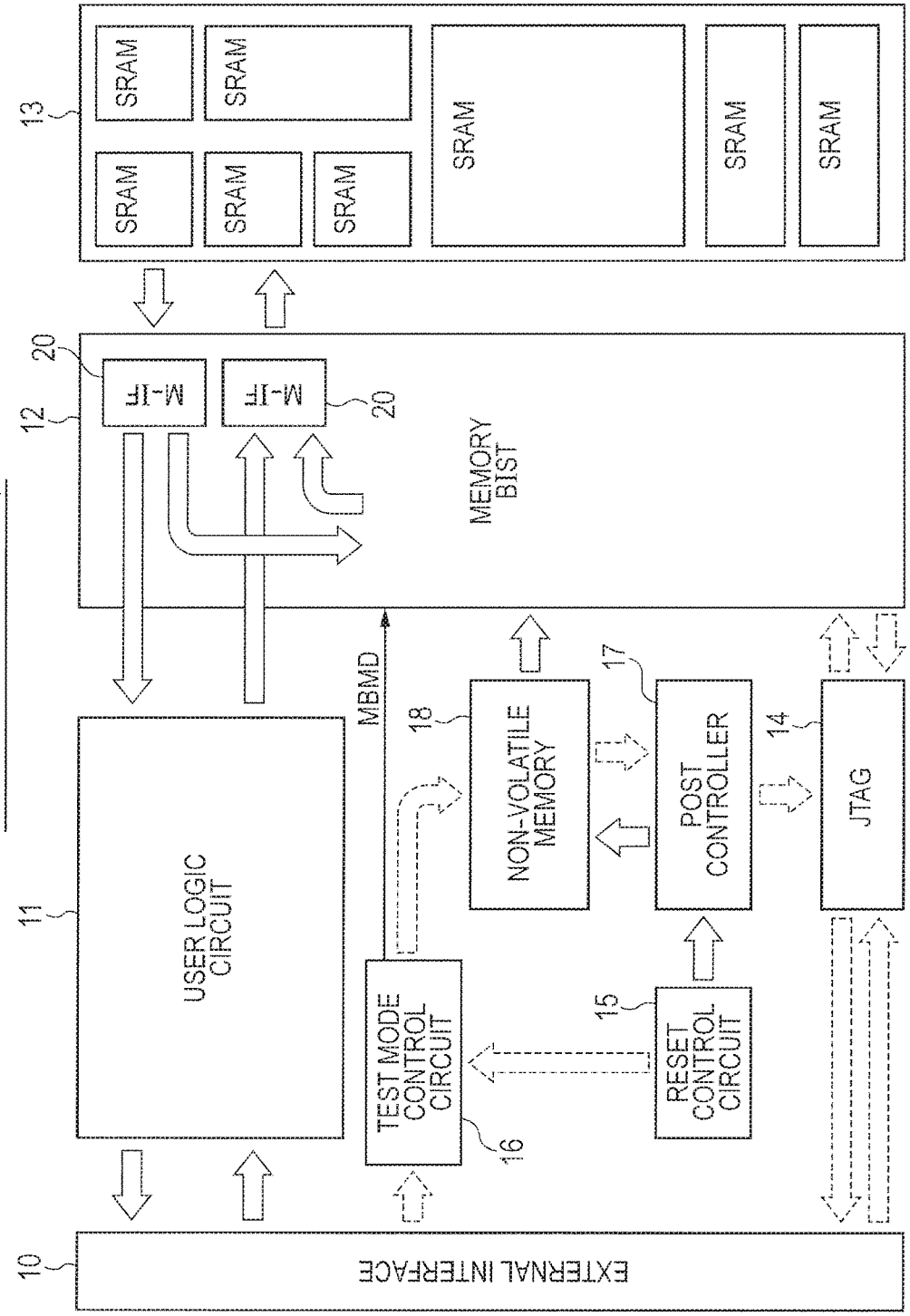
FIG. 4 is a block diagram of the semiconductor device according to the first embodiment, illustrating a third example of the supply path of a test pattern.

FIG. 4 is a block diagram of the semiconductor device 1 according to the first embodiment, illustrating a third example (for example, a third test operation mode) of a supply path of a test pattern. In the third example, the POST controller 17 is caused to operate in response to output of a reset signal by the reset control circuit 15. At this time, the POST controller 17 supplies a test pattern stored in the non-volatile memory 18 to the memory BIST circuit 12. That is, in the third test operation mode, it is possible to supply the test pattern to the memory BIST circuit 12 without using the JTAG controller 14.

Figure 5:
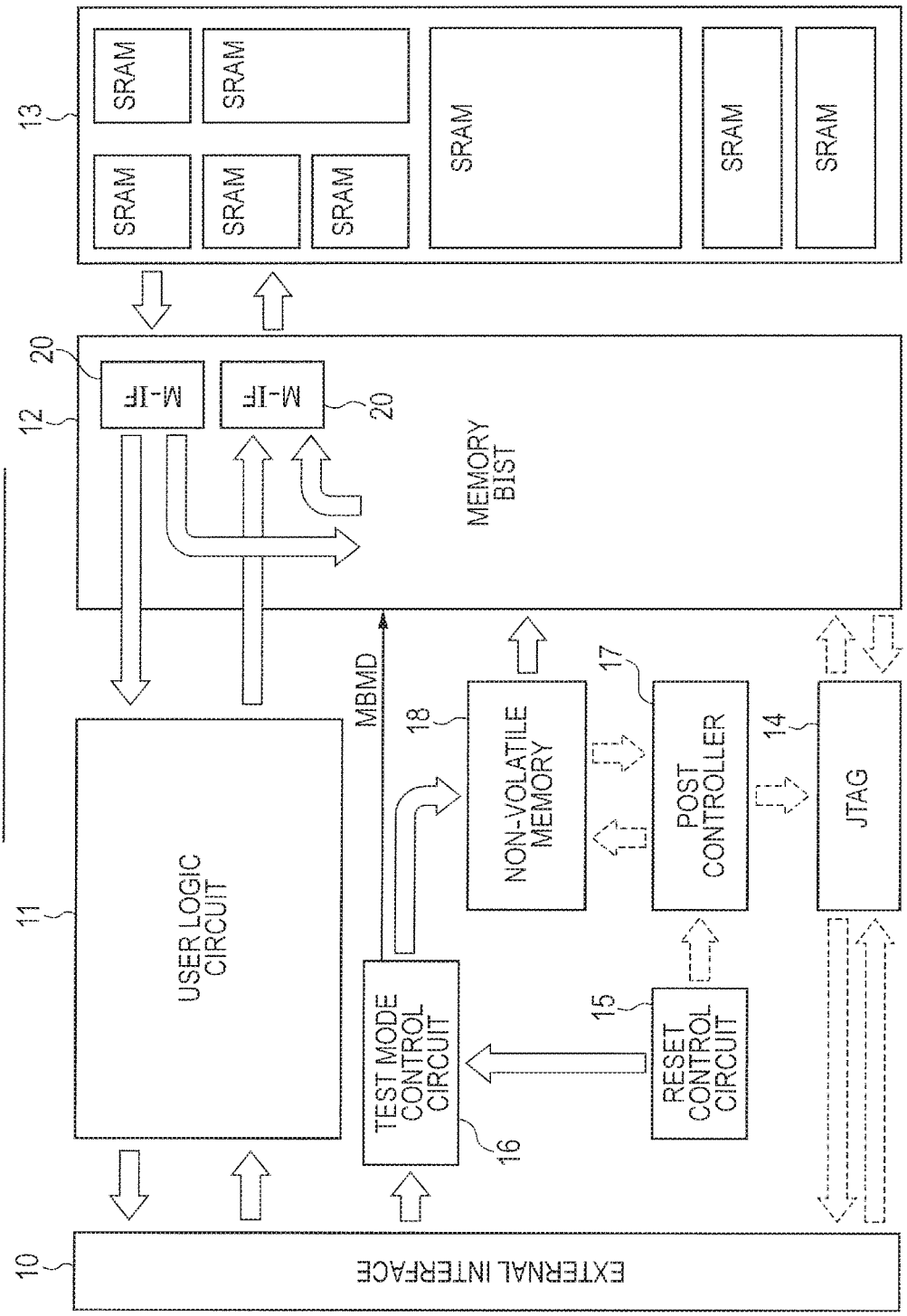
FIG. 5 is a block diagram of the semiconductor device according to the first embodiment, illustrating a fourth example of the supply path of a test pattern.

FIG. 5 is a block diagram of the semiconductor device 1 according to the first embodiment, illustrating a fourth example (for example, a fourth test operation mode) of a supply path of a test pattern. In the fourth example, the test mode control circuit 16 is started in response to output of a reset signal by the reset control circuit 15. Then, a test pattern stored in the non-volatile memory 18 is supplied to the memory BIST circuit 12 on the basis of an instruction supplied from the outside via the external interface circuit 10. That is, in the fourth operation mode, it is possible to supply the test pattern to the memory BIST circuit 12 without using the JTAG controller 14.

As described above, various methods can be considered as the manner of supplying a test pattern to the memory BIST circuit 12, and circuit blocks to be mounted on the semiconductor device 1 are varied depending on which one of the first to fourth examples is employed. It is also possible to mount circuit blocks that can achieve the first and third examples, for example, to achieve a plurality of supply paths of a test pattern.

The semiconductor device 1 according to the first embodiment has one feature in the configuration of the memory BIST circuit 12. More specifically, in the semiconductor device 1 according to the first embodiment, an offset value is set in an offset storage register provided in the memory interface circuit 20 by using an address-shift setting pattern included in a test pattern, and a timing at which a memory array is tested is shifted in time with this offset value. Thus, the configuration of the memory BIST circuit 12 is described in detail below.

Figure 6:
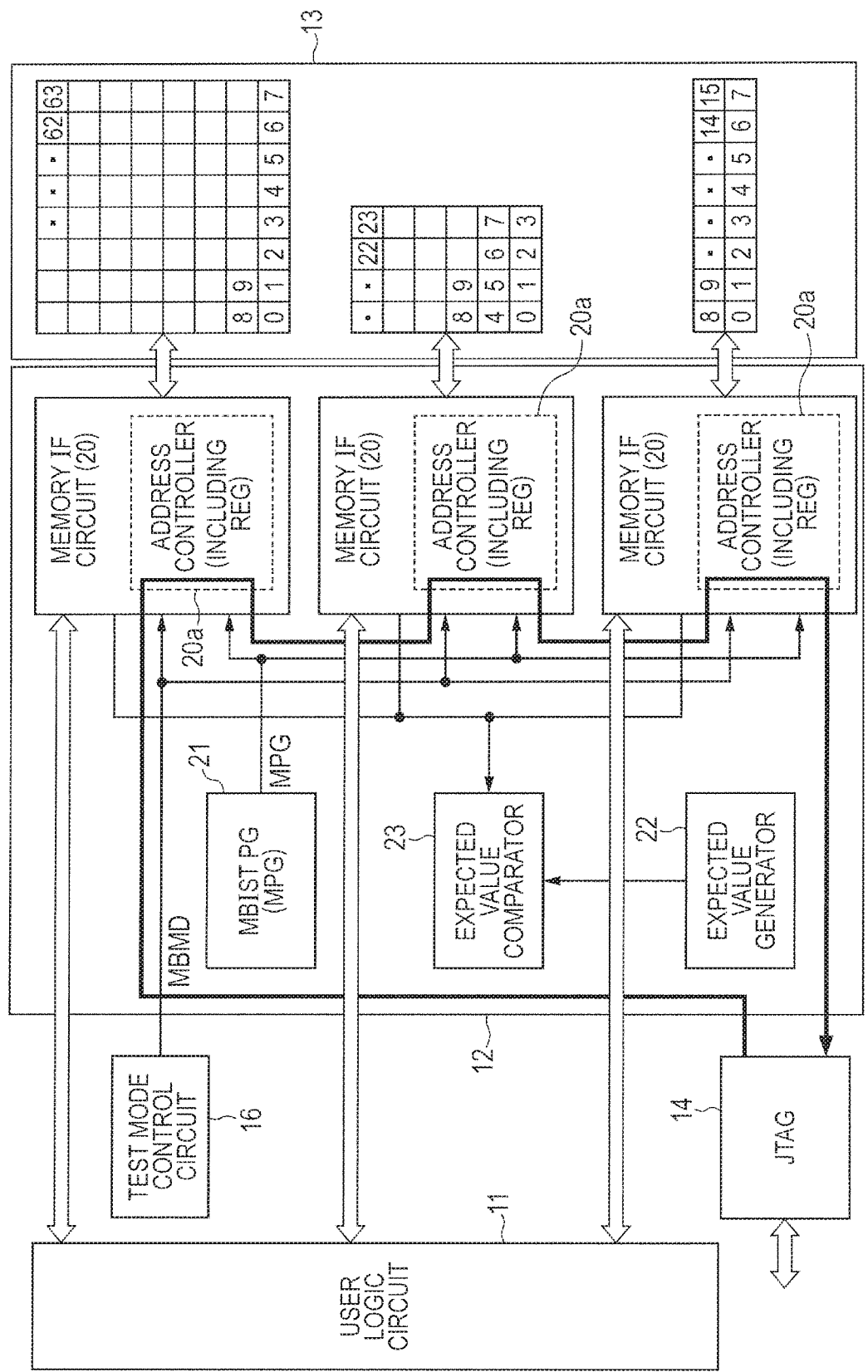
FIG. 6 is a block diagram of a memory BIST circuit in the semiconductor device according to the first embodiment.

FIG. 6 is a block diagram of the memory BIST circuit 12 in the semiconductor device 1 according to the first embodiment. FIG. 6 also illustrates the user logic circuit 11, the internal memory 13, and the JTAG controller 14 together with the memory BIST circuit 12 to describe connections between the memory BIST circuit 12 and other circuits. In the example illustrated in FIG. 6, setting of an address-shift setting pattern in the memory BIST circuit 12 is performed by the JTAG controller 14.

As illustrated in FIG. 6, the memory BIST circuit 12 includes a plurality of memory interface circuits 20, a memory test pattern generation circuit 21, an expected value generator 22, and an expected value comparator 23. The memory test pattern generation circuit 21 generates a test address as an access address during a test for a plurality of memory arrays. The memory test pattern generation circuit 21 also outputs data to be written to a memory cell to be tested (for example, a value of "1" or "0"), read/write control signals, and the like. The expected value generator 22 generates an expected value that is expected in a test performed at that time in accordance with a test sequence. The expected value comparator 23 compares read data read from a memory array and the expected value with each other to determine validity of the memory cell to be tested. Although the memory BIST circuit 12 further includes another component that usually configures a memory BIST circuit, that component is omitted because it is not relevant.

The memory interface circuits 20 are each provided to correspond to one of memory arrays. Each of the memory interface circuits 20 activates one of memory cells of a corresponding one of the memory arrays on the basis of an access address. An output source of an access address and data (including write data and a control signal) input to the memory interface circuit 20 is different depending on an operation mode. For example, in a normal operation mode, the access address and the data are output from the user logic circuit 11. In a test operation mode, the access address and the data are output from the memory test pattern generation circuit 21. It is switched by a value of the test mode control signal MBMD output from the test mode control circuit 16 which one of the output from the user logic circuit 11 or the output from the memory test pattern generation circuit 21 is output to the internal memory 13.

Each of the memory interface circuits 20 includes an address controller 20a. The address controller 20a includes an offset storage register (REF in FIG. 6). This offset storage registers in the memory interface circuits 20 are coupled to one another in daisy chain connection. That is, in the semiconductor device 1 according to the first embodiment, a shift register is configured by using the offset storage registers in the memory interface circuits 20. The JTAG controller 14 supplies an address-shift setting pattern to the offset storage registers by a shifting operation, and supplies an offset value to each offset storage register.

Figure 7:
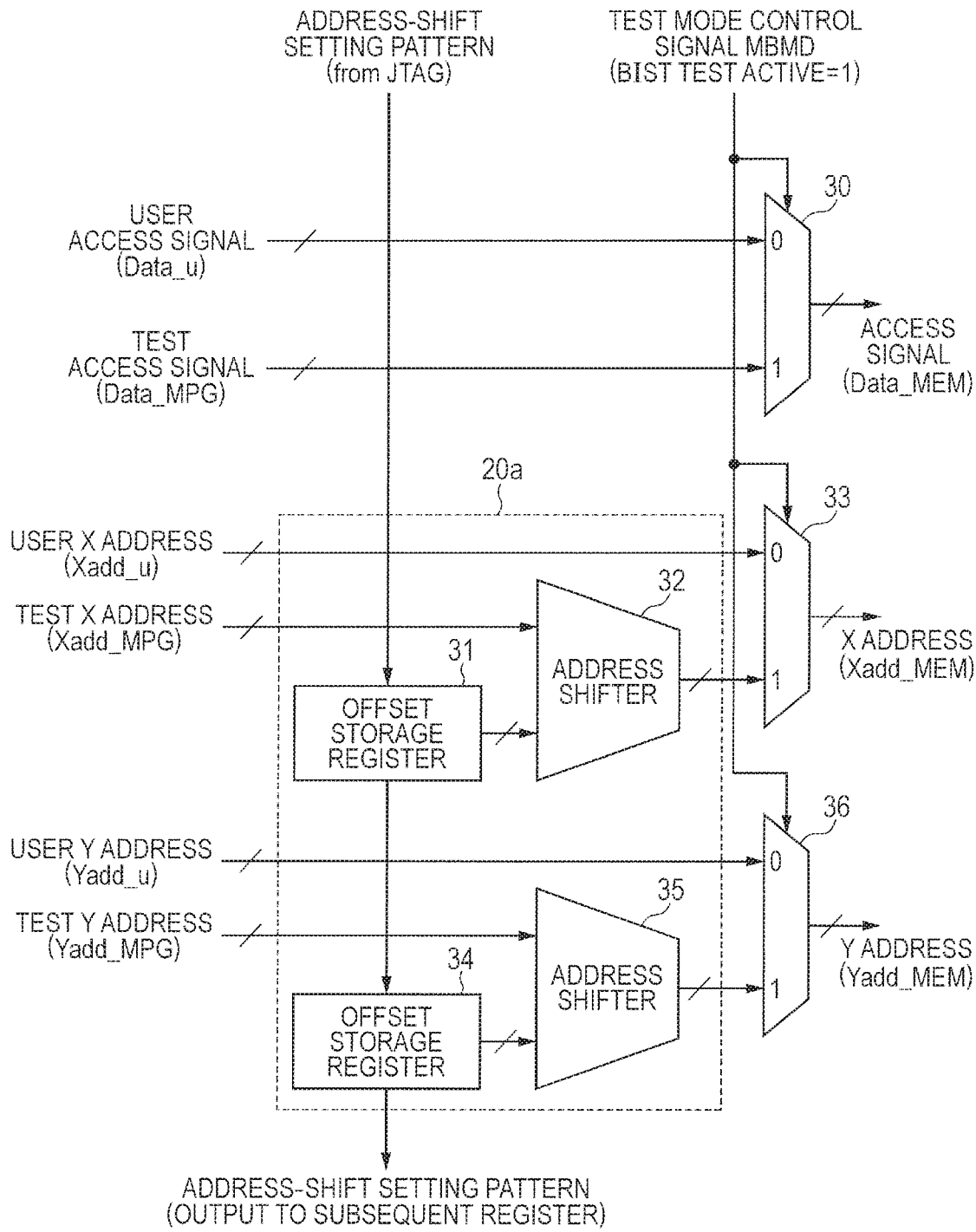
FIG. 7 is a block diagram of a memory interface circuit in the semiconductor device according to the first embodiment.

Next, the memory interface circuit 20 is described in more detail. FIG. 7 is a block diagram of the memory interface circuit 20 in the semiconductor device 1 according to the first embodiment.

In FIG. 7, a signal including write data and a control signal output from the user logic circuit 11 is referred to as a user access signal Data_u, and a signal including write data and a control signal output from the memory test pattern generation circuit 21 is referred to as a test access signal Data_MPG. Further, a signal indicating an address in the X-direction of a memory array in an access address output from the user logic circuit 11 is referred to as a user X address Xadd_u, and a signal indicating an address in the X-direction of a memory array in an access address output from the memory test pattern generation circuit 21 is referred to as a test X address Xadd_MPG. A signal indicating an address in the Y-direction of a memory array in the access address output from the user logic circuit 11 is referred to as a user Y address Yadd_u, and a signal indicating an address in the Y-direction of a memory array in the access address output from the memory test pattern generation circuit 21 is referred to as a test Y-address Yadd_MPG. Further, a signal including write data and a control signal that the memory interface circuit 20 outputs to a corresponding memory array is referred to as an access signal Data_MEM, a signal indicating an X-direction address of a memory array is referred to as an X-address Xadd_MEM, and a signal indicating a Y-direction address of the memory array is referred to as a Y-address Yadd_MEM.

As illustrated in FIG. 7, the memory interface circuit 20 includes a first selection circuit (for example, a selection circuit 33), a second selection circuit (for example, a selection circuit 36), and a third selection circuit (for example, a selection circuit 30), and an address controller 20a. The address controller 20a includes a first offset storage register (for example, an offset storage register 31), a second offset storage register (for example, an offset storage register 34), a first address shifter (for example, an address shifter 32), and a second address shifter (for example, an address shifter 35).

In response to the test mode control signal MBMD, the selection circuit 30 selects the user access signal Data_u in a normal operation mode and selects the test access signal Data_MPG in a test operation mode, and outputs the selected signal as the access signal Data_MEM.

Assuming that an X-direction address of a memory array to be tested in a test address is a first X-address and an actual address of the memory array to be tested is a second X-address, the offset storage register 31 and the address shifter 32 have the following functions. The offset storage register 31 stores therein a first offset value. The first offset values specifies a shift amount between the first X-address and the second X-address in the address shifter 32. The address shifter 32 converts the first X-address to the second X-address by address shifting based on the first offset value. In response to the test mode control signal MBMD, the selection circuit 33 selects, a third X-address (for example, the user X-address Xadd_u) in the normal operation mode and selects the second X-address output from the address shifter 32 in the test operation mode, and outputs the selected signal as the X-address Xadd_MEM.

Assuming that a Y-direction address of the memory array to be tested in the test address is a first Y-address and an actual Y-address of the memory array to be tested is a second Y-address, the offset storage register 34 and the address shifter 35 have the following functions. The offset storage register 34 stores therein a second offset value. The second offset value specifies a shift amount between the first Y-address and the second Y-address in the address shifter 35. The address shifter 35 converts the first Y-address to the second Y-address by address shifting based on the second offset value. In response to the test mode control signal MBMD, the selection circuit 36 selects, the first Y-address (for example, the user Y-address Yadd_u) in the normal operation mode and the second Y-address output from the address shifter 35 in the test operation mode, and outputs the selected signal as the Y-address Yadd_MEM.

In the semiconductor device 1 according to the first embodiment, a shift register circuit is configured by coupling the offset storage registers 31 and 34 in the memory interface circuits 20 in daisy-chain connection. To the offset storage registers 31 and 34 configuring this shift register circuit, an address-shift setting pattern is supplied from the outside by a shifting operation. In the address-shift setting pattern, shift amount data (for example, offset values) indicating shift amounts are arranged in the order of the offset storage registers.

Figure 8:
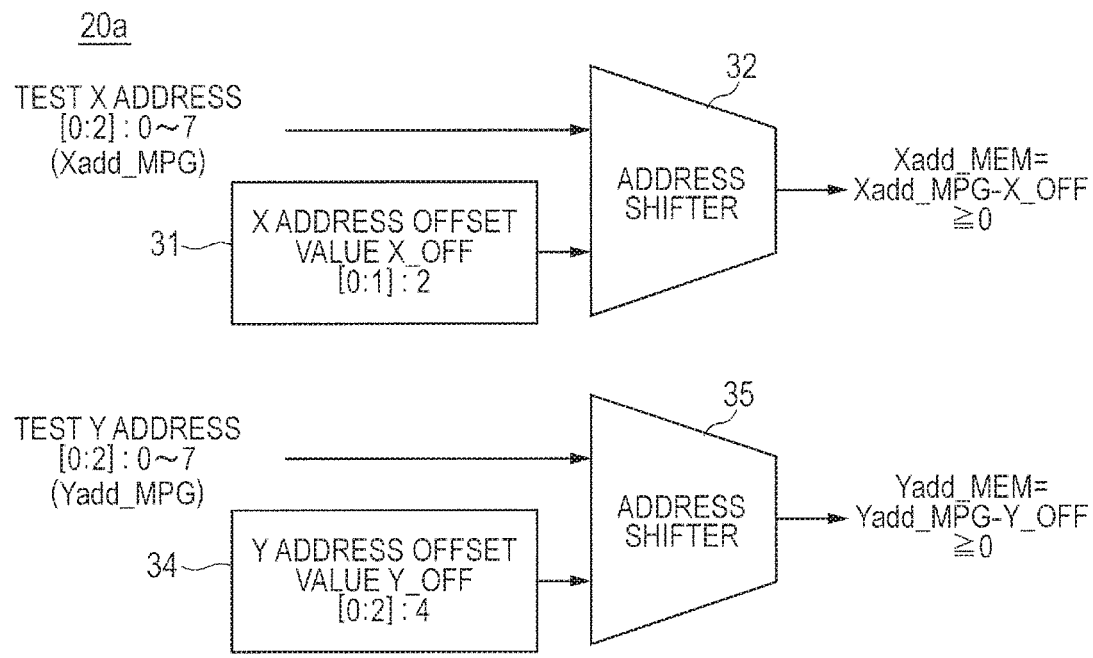
FIG. 8 is a block diagram of the memory interface circuit in the semiconductor device according to the first embodiment, explaining an operation of an address shifter.

Here, operations of the address shifters 32 and 35 according to the first embodiment are described. FIG. 8 is a block diagram of the memory interface circuit 20, explaining the operations of the address shifters 32 and 35 in the semiconductor device 1 according to the first embodiment. FIG. 8 illustrates an operation example in which a memory array having an X-direction size of 6 and a Y-direction size of 4 is shifted in the maximum address space having an X-direction size of 8 and a Y-direction size of 8.

As illustrated in FIG. 8, in the memory interface circuit 20, the first offset value (for example, an X-address offset value X_OFF) is stored in the offset storage register 31. In the example of FIG. 8, the X-address offset value X_OFF is a value represented by 2 bits, and a value "2" is stored in the offset storage register 31.

To the address shifter 32, the first address (for example, the test X-address Xadd_MPG) and the X-address offset value X_OFF are input. The address shifter 32 then outputs a value obtained by subtracting the X-address offset value X_OFF from the test X-address Xadd_MPG, which becomes equal to or larger than 0, as the second X-address (for example, the X-address Xadd_MEM).

In the memory interface circuit 20, the second offset value (for example, a Y-address offset value Y_OFF) is stored in the offset storage register 34. In the example of FIG. 8, the Y-address offset value Y_OFF is a value represented by 3 bits, and a value "4" is stored in the offset storage register 34.

To the address shifter 35, the first Y-address (for example, the test Y-address Yadd_MPG) and the Y-address offset value Y_OFF are input. The address shifter 35 outputs a value obtained by subtracting the Y-address offset value Y_OFF from the test Y-address Yadd_MPG, which becomes equal to or larger than 0, as the second Y-address (for example, the Y-address Yadd_MEM).

That is, the X-address offset value X_OFF is defined in such a manner that the X-address Xadd_MEM has an address value equal to or less than an address value of the test X-address Xadd_MPG. Also, the Y-address offset value Y_OFF is defined in such a manner that the Y-address Yadd_MEM has an address value equal to or less than an address value of the test Y-address Yadd_MPG. The X-address offset value X_OFF and the Y-address offset value Y_OFF are set for every memory interface circuit 20 independently of those for the other memory interface circuit 20.

Figure 9:
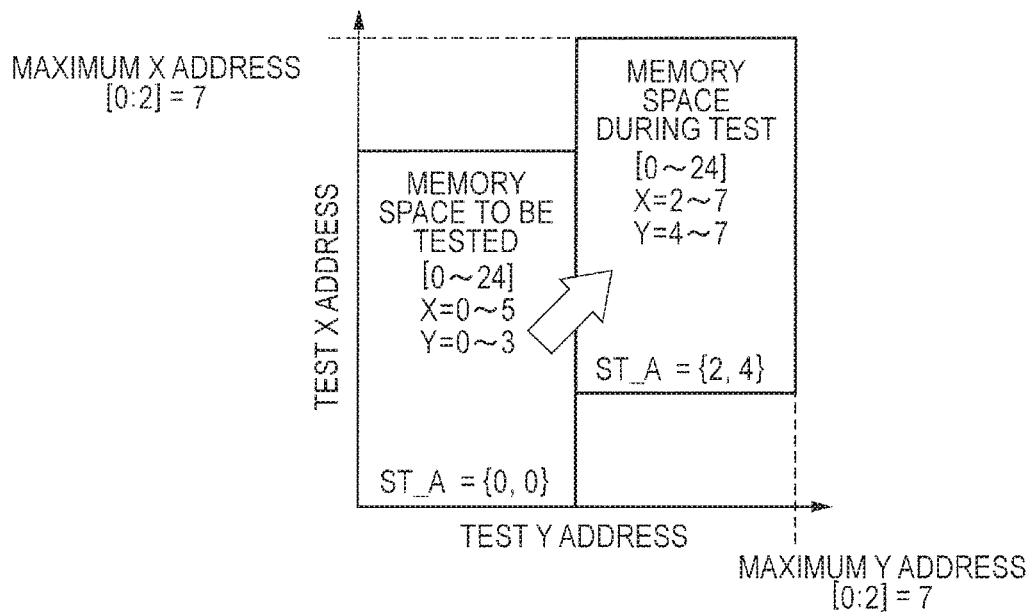
FIG. 9 is an explanatory diagram of a relation between a memory space for a memory array to be tested and a memory space for a memory array during a test in the semiconductor device according to the first embodiment.

The operation illustrated in FIG. 8 is described by using a concept of a memory space. FIG. 9 is an explanatory diagram of a relation between a memory space for a memory array to be tested and a memory space for the memory during a test in the semiconductor device according to the first embodiment. Also in FIG. 9, it is assumed that the memory array has an X-direction size of 6 and a Y-direction size of 4 and the maximum address space has an X-direction size of 8 and a Y-direction size of 8. Further, it is assumed that a memory space to be tested represents an actual address space of a memory array to be tested, and a memory space during the test represents a test address to which a memory access actually occurs.

As illustrated in FIG. 9, when shifting by the memory interface circuit 20 is not performed, the memory space to be tested has an X-direction size of 6 and a Y-direction size of 4 assuming that an X-direction address value and a Y-direction address value of a test start address ST_A are "0, 0".

However, when the memory interface circuit 20 shifts an access address on the basis of the example illustrated in FIG. 8, a test address in the X-direction is shifted in a direction in which it decreases by 2 and a test address in the Y-direction is shifted in a direction in which it decreases by 4. Therefore, a timing at which the memory array to be tested is actually test is in a period in which the X-address of the test address is 2 to 7 and the Y-address thereof is 4 to 7. That is, the memory space during test corresponds to the memory space shifted in the X-direction by 2 and in the Y-direction by 4.

Here, it is described how to determine the number of bits of an offset storage register. The semiconductor device 1 according to the first embodiment prepares the maximum memory space with a size that can accommodate a memory array having the largest X-direction size and a memory array having the largest Y-direction size among a plurality of memory arrays to be tested with one test pattern. Then, a shift amount of a memory array (that is, an offset value) is set in such a manner that all cells of the memory array to be tested are accommodated in this maximum memory space. Therefore, the maximum value of the offset value is determined in accordance with the maximum shift amount for every memory array. In the examples illustrated in FIGS. 8 and 9, the maximum value of the shift amount in the X-direction is 2. Therefore, in the offset storage register 31, the capacity having a size of 2 bits that can represent 2 is specified, and the X-address offset value X_OFF that specifies 2 by using 2 bits is stored. Also, in the examples illustrated in FIGS. 8 and 9, the maximum value of the shift amount in the Y-direction is 4. Therefore, in the offset storage register 34, the capacity having a size of 3 bits that can represent 4 is specified, and the Y-address offset value Y_OFF that specifies 4 by using 3 bits is stored.

In this manner, the number of bits of an offset storage register and an offset value is determined in accordance with the maximum amount of a shift amount during a test of a memory array. Due to this determination method, it is possible to minimize a circuit configuring the offset storage register. Further, by reducing the number of bits of the offset value, it is possible to reduce time required for setting an address-shift setting pattern.

Subsequently, an operation of a memory test in the semiconductor device 1 according to the first embodiment, including the memory BIST circuit 12 having the memory interface circuit 20, is described. First, an example of a memory array to be tested in the semiconductor device according to the first embodiment is illustrated in FIG. 10. The example in FIG. 10 illustrates a memory array used in description of FIGS. 11 and 12.

As illustrated in FIG. 10, memories A to C are used in the following description. The memory A is a memory array including 64 memory cells arranged in a memory space having an X-direction size of 8 and a Y-direction size of 8. The memory B is a memory array including 24 memory cells arranged in a memory space having an X-direction size of 6 and a Y-direction size of 4. The memory C is a memory array including 16 memory cells arranged in a memory space having an X-direction size of 8 and a Y-direction size of 2. The following description will be provided for an example in which each of the memories A to C is tested in an ascending order of memory cells from a memory cell having the smallest cell number.

In each of the memories A to C, when address shifting by the memory interface circuit 20 is not performed, an X-direction address value and a Y-direction address value of a test start address ST_A are "0, 0". Therefore, the memories A to C are arranged in a memory space illustrated in FIG. 10. Specifically, the memories A to C are arranged in a memory space in which the number of simultaneously activated cells is 3.

Subsequently, FIG. 11 illustrates a memory test in the semiconductor device 1 when the memory interface circuit 20 according to the first embodiment is not used. As illustrated in an upper portion of FIG. 11, when the memory interface circuit 20 is not used, the memories A to C are arranged at the same positions as those in the memory space in FIG. 10.

In addition, when the memory interface circuit 20 is not used, power consumption exceeds the maximum allowable power of the semiconductor device in a period in which the number of memory cells that are simultaneously tested is 3, as illustrated in a lower portion of FIG. 11. Meanwhile, regarding test time, tests of all the memories A to C are completed at the same time with completion of the test of the memory A having the maximum number of cells.

Subsequently, FIG. 12 illustrates a memory test in the semiconductor device 1 when the memory interface circuit 20 according to the first embodiment is used. In the example in FIG. 12, by using the memory interface circuit 20 according to the first embodiment, a memory space of the memory B during test is shifted by 4 in the Y-direction, and a memory space of the memory C during test is shifted by 6 in the X-direction. As a result, the semiconductor device 1 according to the first embodiment performs a test in which the number of simultaneously tested cells is suppressed to 2 within a range of the memory space of the memory A that has the largest memory space in a memory space during test, as illustrated in an upper portion of FIG. 12.

Further, as illustrated in a timing chart in a lower portion of FIG. 12, the semiconductor device 1 according to the first embodiment uses the memory interface circuit 20, thereby enabling test time to be suppressed to a period until the test of the memory A is completed, while maintaining the number of simultaneously tested cells which suppresses power consumption to the maximum allowable power or less.

As described above, the semiconductor device 1 according to the first embodiment shifts an address value of a test address output from the memory test pattern generation circuit 21 by a predetermined shift amount for every memory array in the memory interface circuit 20 to generate an address value actually supplied to the memory array. Specifically, in the semiconductor device 1 according to the first embodiment, the X-address offset value X_OFF is stored in the offset storage register 31 in the memory interface circuit 20, and the test-address Xadd_MPG output from the memory test pattern generation circuit 21 is shifted by a shift amount corresponding to the X-address offset value X_OFF to generate the X-address Xadd_MEM. Also, in the semiconductor device 1 according to the first embodiment, the Y-address offset value Y_OFF is stored in the offset storage register 34 in the memory interface circuit 20, and the test Y-address Yadd_MPG output from the memory test pattern generation circuit 21 is shifted by a shift amount corresponding to the Y-address offset value Y_OFF to generate the Y-address Yadd_MEM.

That is, the semiconductor device 1 according to the first embodiment can shift a position of a memory array in a memory space during test from ab actual position in a memory space of the memory array. Further, the semiconductor device 1 according to the first embodiment sets the shift amount independently for every memory array. Therefore, the semiconductor device 1 according to the first embodiment can adjust the number of cells to be tested simultaneously irrespective of an address of an actual memory array, for every test timing. In addition, by making the maximum memory space during test have the maximum size of a memory array to be tested, it is possible to complete a test for another memory array within time required for completion of a memory array having the largest size. From this description, the semiconductor device 1 according to the first embodiment 1 can suppress test time for memory arrays, while suppressing power consumption during a test to the maximum allowable power or less.

Second Embodiment

In a second embodiment, another example of an address shifter is described. In the second embodiment, the same component as that described in the first embodiment is labeled with the same reference sign as that used in the first embodiment and the description thereof is omitted.

Figure 13:
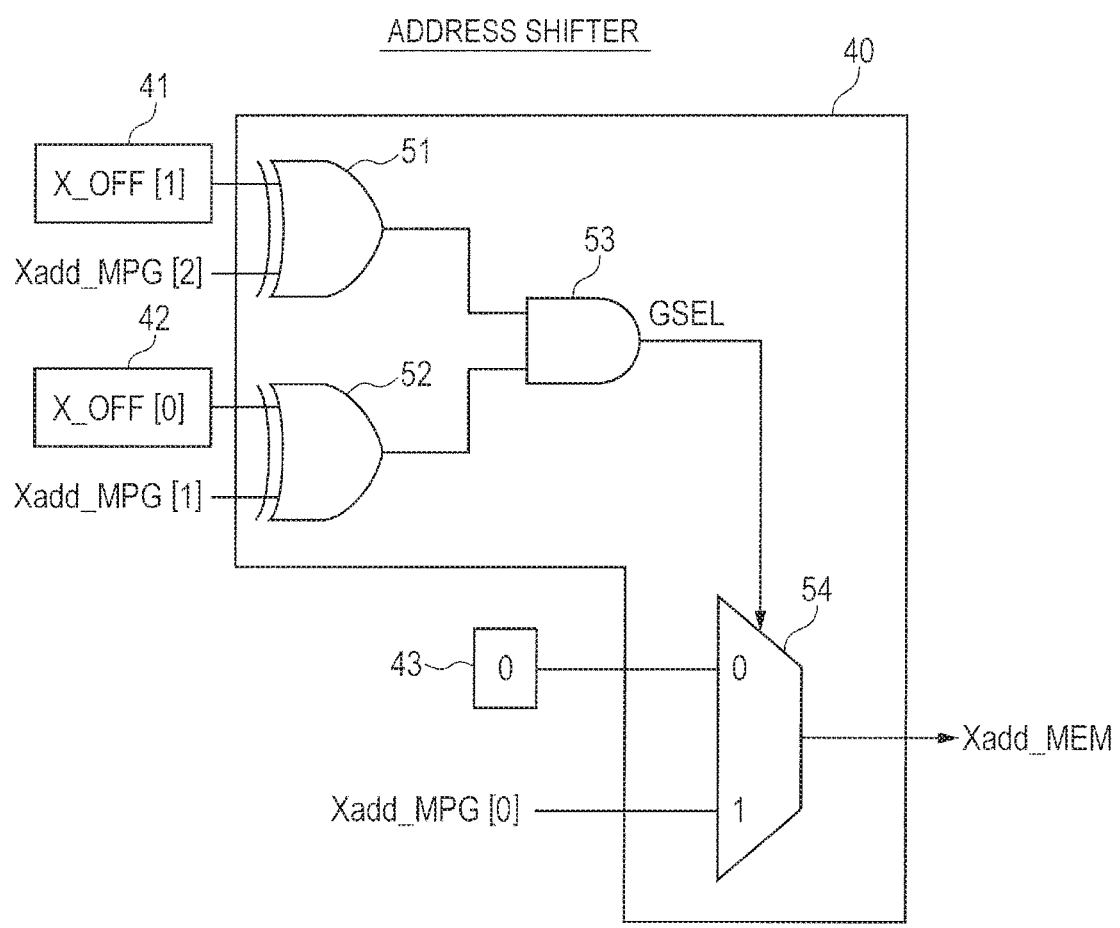
FIG. 13 is a block diagram of an address shifter according to a second embodiment.

FIG. 13 is a block diagram of an address shifter 40 according to the second embodiment. In the example illustrated in FIG. 13, offset storage registers 41 and 42 and an address invalid-value register 43 are illustrated in order to more clarify the circuit configuration of the address shifter 40. The offset storage registers 41 and 42 are registers that each store therein one of bits included in the offset storage register 31 described in the first embodiment. The first bit value of the X-address offset value X_OFF is stored in the offset storage register 41, and the 0th bit value of the X-address offset value X_OFF is stored in the offset storage register 42. The address invalid-value register 43 is a register in which the address shifter 40 stores a value defined as being invalid as an address value.

As illustrated in FIG. 13, the address shifter 40 includes a EXOR circuits 51 and 52, an AND circuit 53, and a selection circuit 54. The EXOR circuit 51 outputs a result of exclusive OR of the first-bit value of the X-address offset value X_OFF and the second bit value of the test X-address Xadd_MPG. The EXOR circuit 52 outputs a result of exclusive OR of the 0th-bit value of the X-address offset value X_OFF and the first bit value of the test X-address Xadd_MPG.

The AND circuit 53 switches a value of a selection signal GSEL on the basis of a result of AND of the output value of the EXOR circuit 51 and the output value of the EXOR circuit 52. The selection circuit 54 selects an invalid address value (for example, 000) stored in the address invalid-value register 43 and outputs the selected value as the X address Xadd_MEM, when the selection signal GSEL has a value "0". Also, the selection circuit 54 selects the 0th-bit value of the test X-address Xadd_MPG and outputs a 3-bit value (for example, 000, 001) including the selected value as the least significant bit as the X-address Xadd_MEM, when the selection signal GSEL has a value "1".

The same configuration as the address shifter illustrated in FIG. 13 can be also used as the offset storage register 34.

That is, the memory interface circuit 20 according to the second embodiment has the following configuration, regarding the offset storage register 31, the address shifter 32, the offset storage register 34, and the address shifter 35 as the first offset storage register, the first address shifter, the second offset storage register, and the second address shifter, respectively.

The first offset storage register (for example, the offset storage register 31) stores therein an offset value having an N-bit size (N is an integer) as the first offset value (for example, the X-address offset value X_OFF), where N is smaller than the number of bits of the first X-address (for example, the test X-address Xadd_MPG).

The first address shifter (for example, the address shifter 40) includes a plurality of first exclusive OR circuits (for example, the EXOR circuits 51 and 52) and a first gate circuit (for example, a circuit configured by the AND circuit 53 and the selection circuit 54). The EXOR circuits 51 and 52 calculate exclusive OR of values of N bits of the X-address offset value X_OFF and values of upper N bits of the test X-address Xadd_MPG, respectively. The circuit configured by the AND circuit 53 and the selection circuit 54 outputs values of the test X-address Xadd_MPG other than the upper N bits, as a third X-address (for example, the X-address Xadd_MEM) when all outputs of the first exclusive OR circuits become 1.

The second offset storage register stores therein an offset value having an M-bit size (M is an integer) as the second offset value (for example, the Y-address offset value Y_OFF), where M is smaller than the number of bits of the test Y-address Yadd_MPG.

The second address shifter (for example, the address shifter 40) includes a plurality of second exclusive OR circuits (for example, the EXOR circuits 51 and 52) and a second gate circuit (for example, a circuit configured by the AND circuit 53 and the selection circuit 54). The EXOR circuits 51 and 52 calculate exclusive OR of values of M bits of the Y-address offset value Y_OFF and values of upper M bits of the test Y-address Yadd_MPG, respectively. The circuit configured by the AND circuit 53 and the selection circuit 54 outputs values of the test Y-address Yadd_MPG other than the upper M bits, as a third Y-address (for example, the Y-address Yadd_MEM) when all outputs of the second exclusive OR circuits become 1.

Subsequently, an operation of the address shifter 40 according to the second embodiment is described on the basis of input and output values of the address shifter illustrated in FIG. 13. FIG. 14 illustrates input and output values of the address shifter 40 according to the second embodiment in form of a table. Although the table in FIG. 14 relates to address conversion in the X-direction, similar shifting to that in the table in FIG. 14 can be applied to address conversion in the Y-direction. In addition, in the example illustrated in FIG. 14, a shift amount is 2 to the first power, that is, a multiple of 2.

As illustrated in FIG. 14, to achieve the X-direction shift amount of 6, the address shifter 40 sets, as the X-address offset value X_OFF, "00" that are opposite to the upper two bits of the test X address Xadd_MPG that has a value of 6 to 7. In this case, when "110" or "111" is input as the test X-address Xadd_MPG, "000" or "001" is output as the X-address Xadd_MEM.

Further, to achieve the X-direction shift amount of 4, the address shifter 40 sets, as the X-address offset value X_OFF, "01" that are opposite to the upper 2 bits of the test X address Xadd_MPG that has a value of 4 to 5. In this case, when "100" or "101" is input as the test X-address Xadd_MPG, "000" or "001" is output as the X-address Xadd_MEM.

Furthermore, to achieve the X-direction shift amount of 2, the address shifter 40 sets, as the X-address offset value X_OFF, "10" that are opposite to the upper 2 bits of the test X-address Xadd_MPG that has a value of 2 to 3. In this case, when "010" or "011" is input as the test X-address Xadd_MPG, "000" or "001" is output as the X-address Xadd_MEM.

Furthermore, to achieve the X-direction shift amount of 0, the address shifter 40 sets, as the X-address offset value X_OFF, "11" that are opposite to the upper 2 bits of the test X-address Xadd_MPG that has a value of 0 to 1. In this case, when "000" or "001" is input as the test X-address Xadd_MPG, "000" or "001" is output as the X-address Xadd_MEM.

As described above, a semiconductor device employing the address shifter 40 according to the second embodiment can reduce its circuit scale, although a shift amount of a test timing of a memory array is limited to values of 2 to the n-th power, e.g., 2, 4, and 8.

Third Embodiment

In a third embodiment, kinds of the X-address offset value X_OFF and the Y-address offset value Y_OFF are described, which are to be supplied to the offset storage register 31 and the offset storage register 34. FIG. 15 illustrates an example of power profiles set for a semiconductor device according to the third embodiment in a table format.

In the example illustrated in FIG. 15, four profiles are illustrated for every transition profile of power consumption during a memory test period. The first power profile has a feature that transition is caused to occur to minimize change in power during a test period. The second power profile is a profile in which transition of power consumption is caused to occur in such a manner that power consumption is increased in a latter half of the test period. The third power profile is a profile in which transition of power consumption is caused to occur in such a manner that power consumption is increased in a first half of the test period. The fourth power profile is a profile for performing an overload test in which power consumption reaches or exceeds allowable power consumption during the test period.

In each of the first to fourth power profiles, a shift amount for a memory array is defined. By using the shift amount for the memory array defined for each power profile, an address-shift setting pattern is generated. Then, one address-shift setting pattern selected from the thus generated test patterns is supplied to a shift register circuit including the offset storage register 31 and the offset storage register 34, so that the semiconductor device according to the third embodiment can perform a test based on each power profile.

Further, by storing each power profile in the non-volatile memory 18, it is possible to perform a test based on a plurality of power profiles after the semiconductor device is shipped.

Fourth Embodiment

A fourth embodiment describes an example of a circuit used as the offset storage registers 31 and 34. In the fourth embodiment, the same component as that described in the first embodiment is labeled with the same reference sign as that in the first embodiment and the description thereof is omitted.

Figure 16:
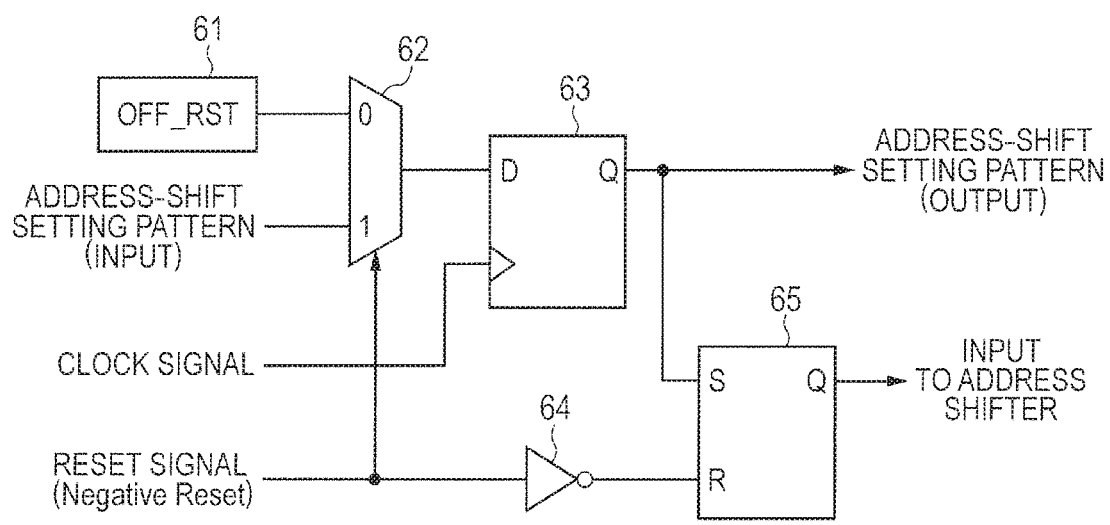
FIG. 16 is a block diagram of an offset storage register according to a fourth embodiment.

FIG. 16 is a block diagram of an offset storage register according to a fourth embodiment. As illustrated in FIG. 16, the offset storage register according to the fourth embodiment includes a resetting offset-value storing register 61, a selection circuit 62, a D flip-flop 63, an inverter 64, and an SR latch 65.

The resetting offset-value storing register 61 is a non-volatile memory. In the resetting offset-value storing register 61, a resetting offset value OFF_RST is stored. The selection circuit 62 selects the resetting offset value OFF_RST stored in the resetting offset-value storing register 61 when a reset signal indicates a reset state (e.g., a low level), and selects an address-shift selecting pattern when the reset signal indicates a reset-released state (e.g., a high level).

The D flip-flop 63 holds a value of a signal input to its data input terminal D at an input timing of a rising edge of a clock signal until the next rising edge of the clock signal is input, and outputs the held value from its output terminal Q. The inverter 64 inverts the reset signal and outputs it. The SR latch 65 outputs a high level from its output terminal Q in response to input of a rising edge to its set terminal S, and places a logic level of the output terminal Q at a low level in response to input of a rising edge to its reset terminal R. The output signal of the D flip-flop 63 serves as a test pattern signal to be supplied to an offset storage register in a subsequent stage. Further, the output signal of the inverter 64 is input to an address shifter.

The offset storage register illustrated in FIG. 16 has a resetting offset value. However, when the resetting offset value is not used, the offset storage registers 31 and 34 can be configured by the D flip-flop 63 only.

The offset storage register according to the fourth embodiment illustrated in FIG. 16 supplies the resetting offset value OFF_RST stored in the resetting offset-value storing register 61 to an address shifter by the SR latch 65 in a period in which a semiconductor device performs a reset process. That is, in the semiconductor device employing the offset storage register according to the fourth embodiment, each of the offset storage registers 31 and 34 holds a predetermined resetting offset value in response to a reset signal, and sets the resetting offset value as an offset value to be output from itself in response to change of the reset signal to an active state.

By the above configuration, in the reset process, the semiconductor device according to the fourth embodiment can supply an offset value to an address shifter by using a resetting offset value stored in the resetting offset-value storing register 61, without setting a test pattern. Therefore, the semiconductor device according to the fourth embodiment can reduce time required for setting the offset value after the reset process. Further, even in a period of the reset process in which power consumption tends to increase because of concurrent operations of the user logic circuit 11 and the like caused by the reset process, it is possible to test memory arrays without causing excess power by setting the offset value based on a power profile that suppresses power consumption.

Fifth Embodiment

In a fifth embodiment, the description is provided to a method of building in the memory BIST circuit 12 and a method of generating a test pattern described in the above embodiments. Also in the fifth embodiment, the same component as that described in the first embodiment is labeled with the same reference sign as that in the first embodiment and the description thereof is omitted.

A process of incorporating in the memory BIST circuit 12 and a test pattern generation process described in the fifth embodiment are performed by a test circuit generation program and a test pattern generation program. The test circuit generation program and the test pattern generation program are executed by a computer that includes an operation device executing a program, such as a CPU, a memory used in execution of the program, a hard disk storing therein the program, a display device displaying a user interface, and an input device, such as a keyboard.

Figure 17:
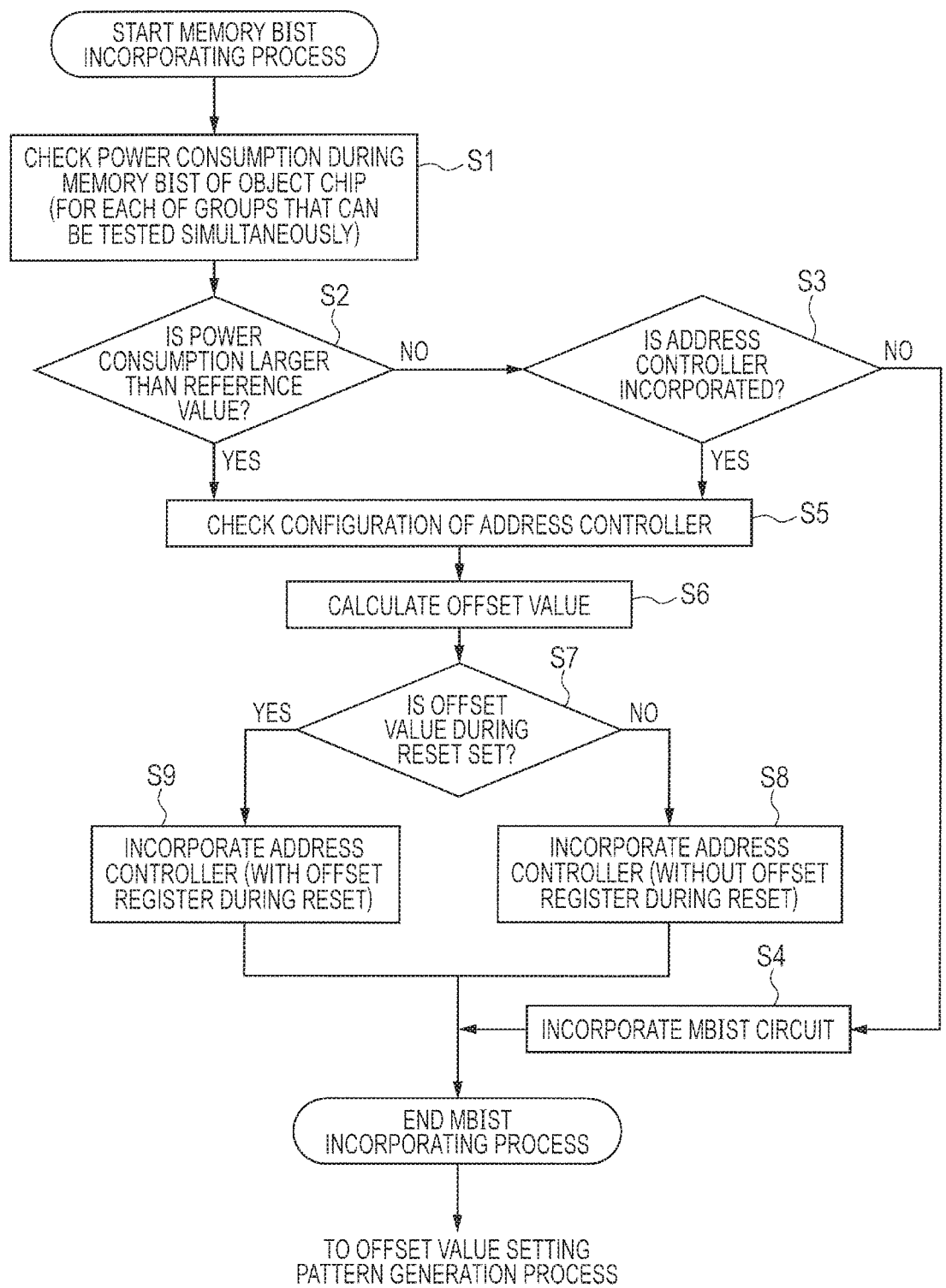
FIG. 17 is a flowchart illustrating an operation of a test circuit generation process according to a fifth embodiment.

When the memory BIST circuit 12 described in the above embodiments is incorporated, a memory BIST incorporation process that incorporates the memory BIST circuit 12 into circuit information in which circuit information on the user logic circuit 11 and the like is described. FIG. 17 is a flowchart illustrating an operation of the test circuit generation process according to the fifth embodiment. The following description refers to the address controller 20a as a circuit into which incorporation is performed. This address controller 20a is a circuit including the offset storage register 31, the address shifter 32, the offset storage register 34, and the address shifter 35 that have been in the first embodiment.

In the memory BIST incorporation process, power consumption during a memory BIST for an object chip is checked first, as illustrated in FIG. 17 (Step S1). In the power consumption checking process in Step S1, memory arrays that can use a common address value as an X-address or a Y-address and of which power consumption falls within a certain range are grouped into one. For every group, power consumption is estimated.

Subsequently, it is determined whether power consumption for every group calculated in Step S1 is larger than a reference value (for example, allowable maximum power) (Step S2). For a group having larger power consumption than the reference value in the determination in Step S2, a process for incorporating the address controller 20a is performed (Step S5). Meanwhile, for a group having power consumption equal to or smaller than the reference value, it is determined whether to incorporate the address controller 20a (Step S3). When it has been determined in the process in Step S3 that the address controller 20a is not incorporated (NO in Step S3), the memory BIST circuit 12 without the address controller 20a is incorporated into circuit information (Step S4). When it has been determined in the process in Step S3 that the address controller 20a is incorporated (YES in Step S3), a process for incorporating the address controller 20a is performed (Step S5).

In the process in Step S5, it is determined which memory array the address controller 20a is provided to correspond to, how many bits a test address converted in the address controller 20a has, and the like.

Subsequently, a process of calculating offset values is performed (Step S6). The offset values are to be stored in the offset storage register 31 and the offset storage register 34 of the address controller 20a. It is then determined whether to use a resetting offset value (Step S7). When it has been determined in Step S7 that the resetting offset value is not used, the offset storage register described in FIG. 16 of the fourth embodiment is incorporated into the memory BIST circuit 12 (Step S9). Meanwhile, when it has been determined in Step S7 that the resetting offset value is used, an offset storage register that does not include a circuit for using the resetting offset value, for example, the resetting offset storage register 61, is incorporated into the memory BIST circuit 12 (Step S8).

Figure 18:
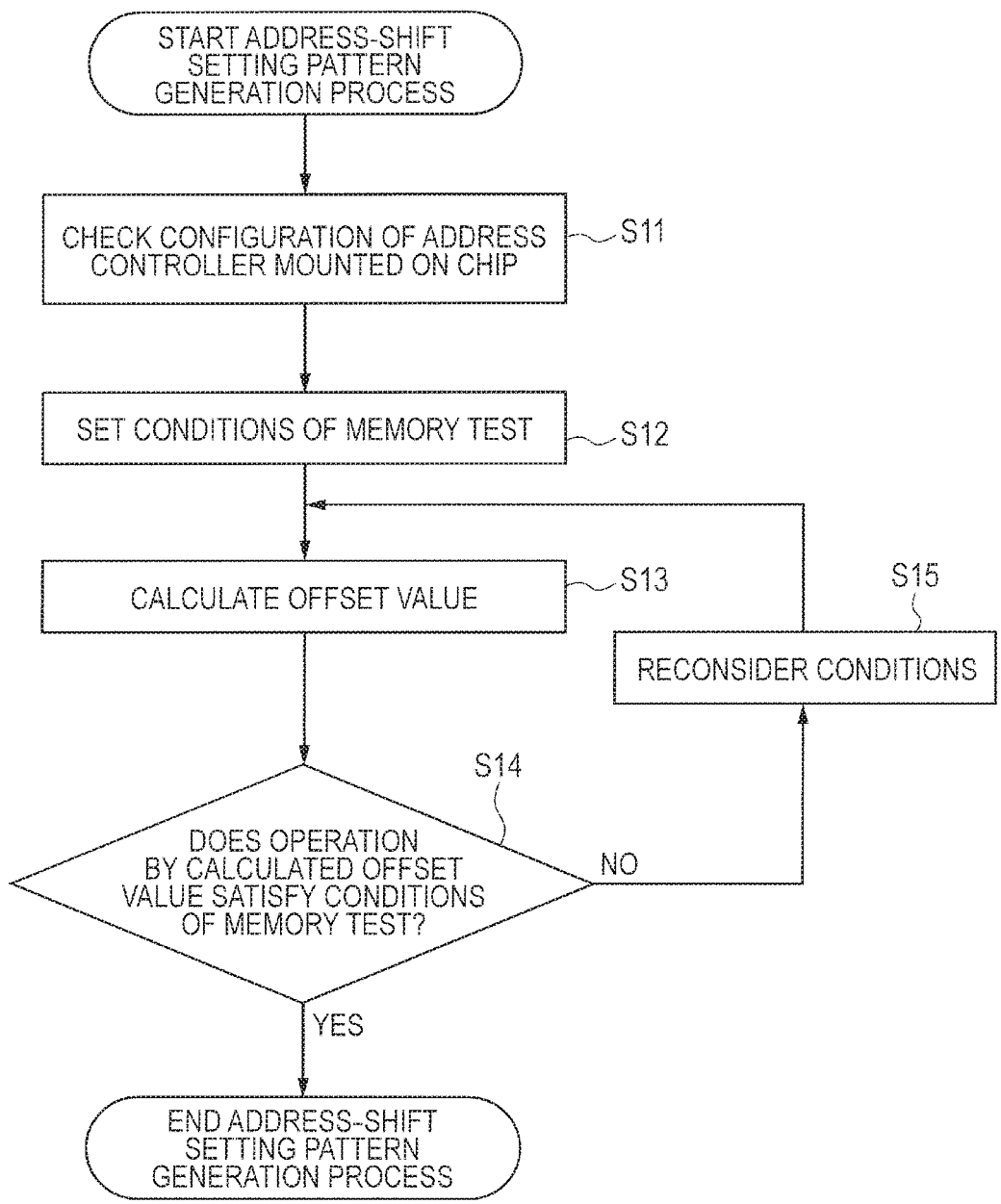
FIG. 18 is a flow chart illustrating an operation of an address-shift setting pattern generation process according to the fifth embodiment.

In the fifth embodiment, the configuration of the memory BIST circuit 12 is determined through the above processes. Then, after the configuration of the memory BIST circuit 12 is determined, an address-shift setting pattern to be supplied to the memory BIST circuit 12 as one of test patterns is generated. FIG. 18 is a flowchart illustrating an operation of an address-shift setting pattern generation process according to the fifth embodiment.

In the address-shift setting pattern generation process, the configuration of the address controller 20a mounted on a chip is checked in accordance with the process flow described in FIG. 17, first, as illustrated in FIG. 18 (Step S11). More specifically, in the checking process in Step S11, information on the number of bits of each of the offset storage registers 31 and 34, the size of a corresponding memory array, and the like is acquired.

Subsequently, in the address-shift setting pattern generation process, conditions of a memory test are set (Step S12). In this Step S12, conditions such as a power profile described in the third embodiment are set, for example. Thereafter, in the address-shift setting pattern generation process, an offset value is calculated (Step S13).

Then, power consumption of a memory test to which the offset value calculated in Step S13 is applied is calculated, and it is considered whether the calculated power consumption satisfies the conditions set in Step S12 (Step S14). When it has been determined that an operation state in the test by the offset value calculated in Step S13 does not satisfy the conditions in Step S14 (No in Step S14), the conditions used for calculation of the offset value is reconsidered (Step S15). In Step S15, a transition condition of power consumption defined by a power profile is reconsidered within a range of the conditions set in Step S12, for example. Then, on the basis of the condition reconsidered in Step S15, the process of calculating the offset value in Step S13 is performed again. Meanwhile, when it has been determined that the operation state in the test by the offset value calculated in Step S13 satisfies the conditions in Step S14 (YES in Step S14), the address-shift setting pattern generation process is ended.

The process flows illustrated in FIGS. 17 and 18 describe a procedure of generating the memory BIST circuit 12 and an address-shift setting pattern. Actually, the memory BIST circuit 12 and the address-shift setting pattern are generated by using a DFT (Design For Test) function of a circuit designing program that generates the memory BIST circuit 12 (for example, a test circuit generation program).

Figure 19:
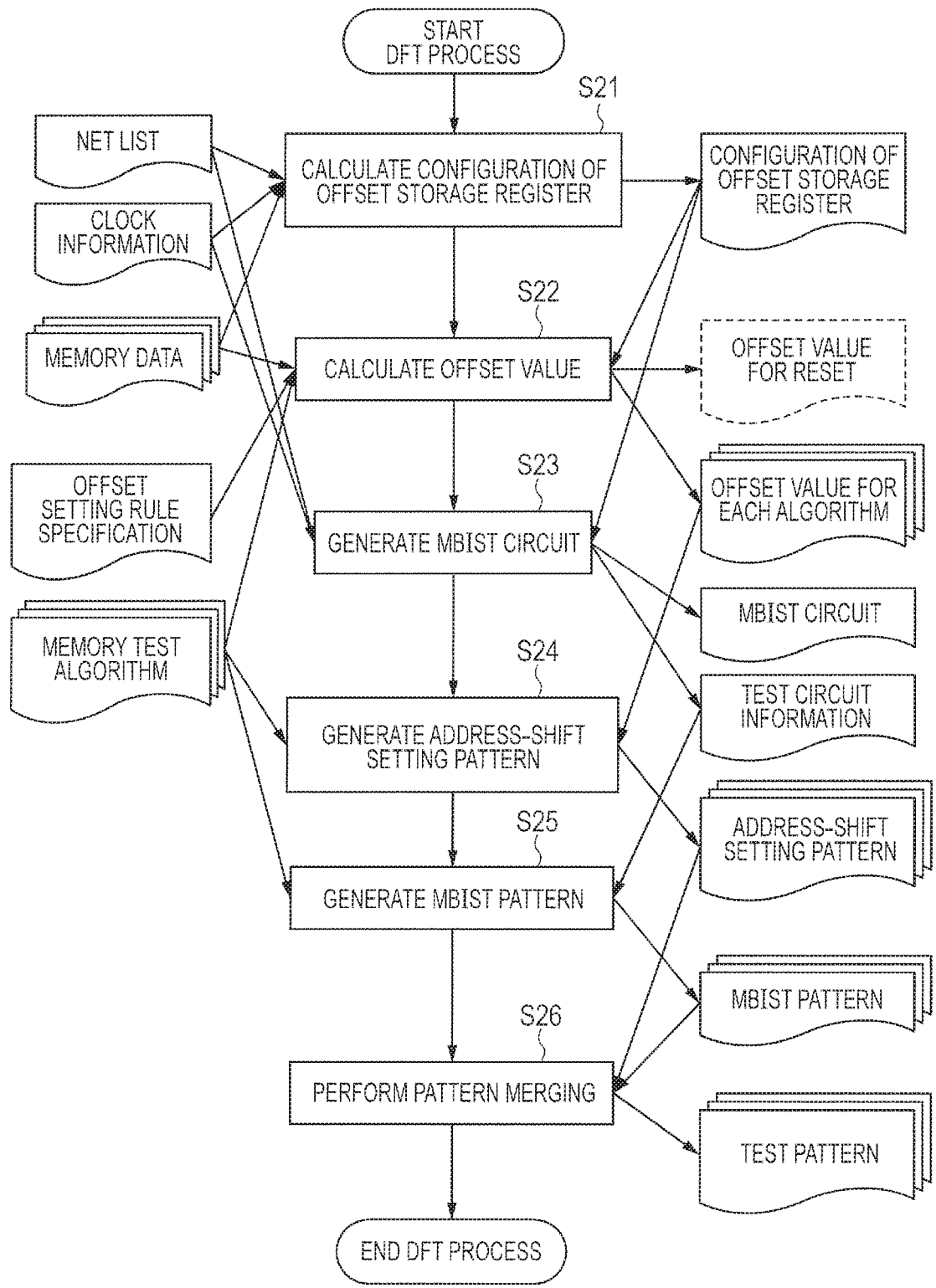
FIG. 19 is a flowchart illustrating a test circuit generation program and its operation according to the fifth embodiment.

Therefore, while a procedure in a DFT process of the circuit designing program is described, a program of generating a test pattern that includes the memory BIST circuit 12 and the address-shift setting pattern is described. FIG. 19 is a flowchart illustrating an operation of a test circuit generation program according to the fifth embodiment.

When the DFT process is started by the test circuit generation program, the test circuit generation program calculates the configuration of an offset storage register, first (Step S21), as illustrated in FIG. 19. In the process in this Step S21, a net list that is information on connection of elements of a circuit other than a test circuit in a semiconductor device, clock information that includes information on distribution of a clock used in the semiconductor device and timing information of the clock, memory data that describes the size of a memory array mounted on the internal memory 13 of the semiconductor device, and the like are read. In the process in Step S21, then read information is analyzed to calculate whether the address controller 20a is present in the memory circuit 12 and to calculate the required number of the address controllers 20a. That is, in the process in Step S21, the processes in Steps S1 to S3 and S5 illustrated in FIG. 17 are performed. In association with completion of the process in FIG. 21, a file describing the configuration of the offset storage register is generated.

Subsequently, the test circuit generation program calculates an offset value to be stored in the offset storage register (Step S22). In the process in this Step S22, memory data, an offset setting rule specification, a memory test algorithm, and configuration information of the offset storage register are read. The offset setting rule specification defines whether to input an offset value by using the JTAG controller 14 or to supply the offset value to the memory BIST circuit 12 while holding the offset value in the non-volatile memory 18. The memory test algorithm defines which of power profiles a memory array is tested with. Then, in the process in Step S22, the offset value is calculated by using the read information. This offset value calculation process corresponds to the processes in Steps S6 to S9 in FIG. 17. In this Step S22, the offset value is generated for every memory-test algorithm. Further, when a resetting offset value is used, this resetting offset value is generated in this Step S22.

Subsequently, the test circuit generation program performs a memory BIST circuit generation process that defines a specific circuit configuration of the memory BIST circuit 12 (Step S23). In the process in this Step S23, the nest list, the clock information, and the configuration information of the offset storage register are read in. Then, a specific circuit of the memory BIST circuit 12 is synthesized on the basis of the read information, and memory BIST circuit information (the MBIST circuit in FIG. 19) and test circuit information that includes information on arrangement of registers required for performing a test using the memory BIST circuit 12 are generated in Step S23.

Subsequently, the test circuit generation program generates an address-shift setting pattern (Step S24). In the process in Step S24, the address-shift setting pattern is generated on the basis of the offset value for every algorithm, generated in Step S22, and the memory test algorithm.

Subsequently, the test circuit generation program generates a memory BIST pattern (the MBIST pattern in FIG. 19) (Step S25). In the process in Step S25, the memory BIST pattern is generated on the basis of the test circuit information generated in Step S23 and the memory test algorithm. This memory BIST pattern includes the order of activation of memory cells in a memory array and information on write data to be used in a test sequence.

Subsequently, the test circuit generation program merges the address-shift setting pattern generated in Step S24 and the memory BIST pattern generated in Step S25 to generate one test pattern file (Step S26). When this Step S26 is completed, the DFT process is ended.

Figure 20:
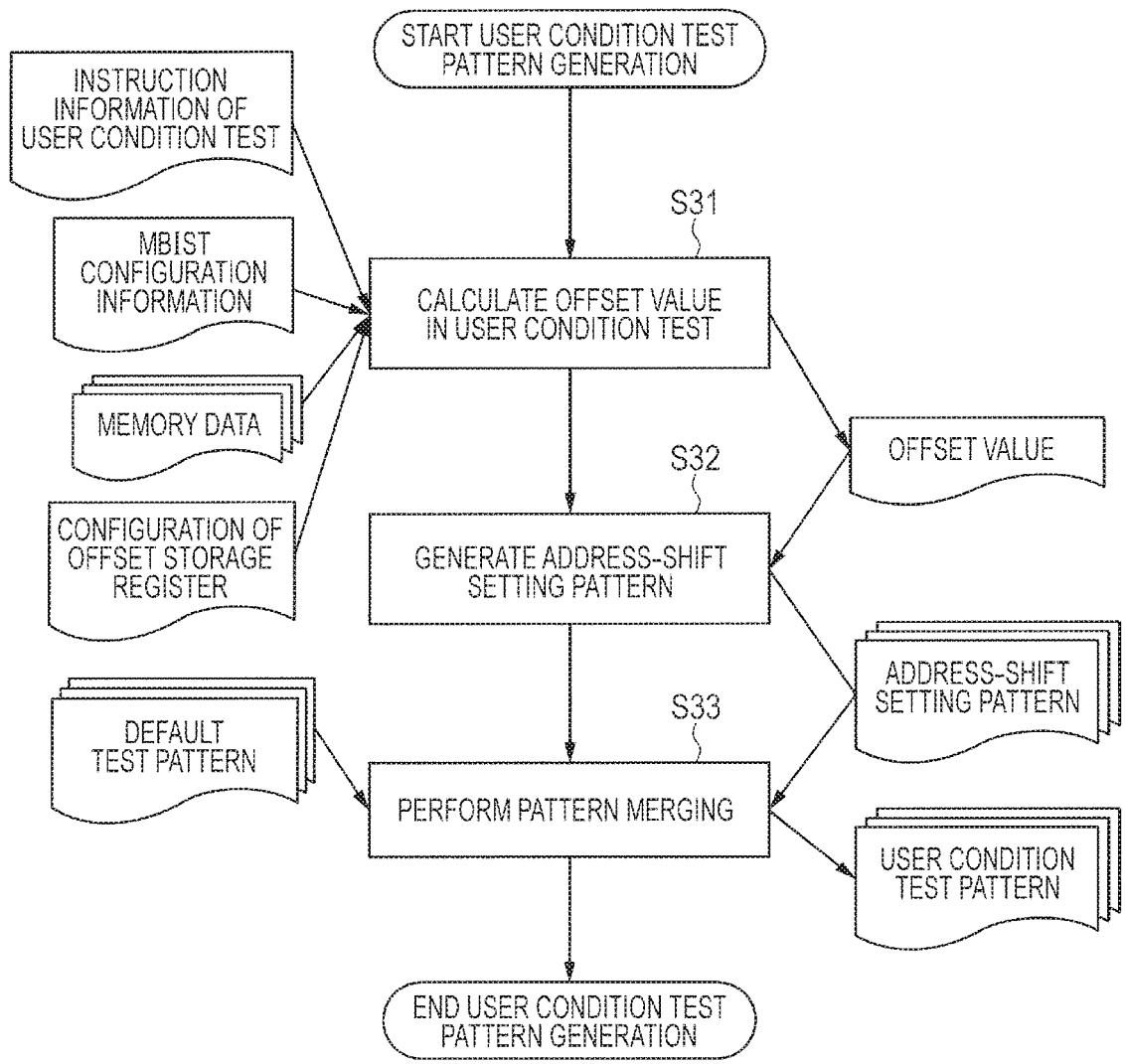
FIG. 20 is a flowchart illustrating an operation of the test circuit generation program based on a user condition according to the fifth embodiment.

A test pattern to be applied to a semiconductor device described in the above embodiments can be also added even after the semiconductor device is shipped. Therefore, a test pattern adding process is described below, which is performed independently of the test circuit generation process. In addition, the following description explains a process of generating a user condition test pattern that is used when a test with a condition set by a user in any manner in a test pattern generated when a semiconductor device is designed is performed. FIG. 20 is a flowchart illustrating an operation of a test pattern generation program according to the fifth embodiment.

First, an offset value to be applied in a user condition test is calculated in the test pattern generation program (Step S31), as illustrated in FIG. 20. In Step S31, instruction information of the user condition test, which describes a power transition condition specified by a user and the like, MBIST configuration information that describes the circuit configuration of the memory BIST circuit 12, memory data, and configuration information of an offset storage register are read. Then, in Step S31, the offset value that satisfies the instruction information of the user condition test is calculated by using the read information. In Step S31, the offset value is newly generated to correspond to the user condition test.

Subsequently, the test pattern generation program generates an address-shift setting pattern on the basis of the offset value generated in Step S31 (Step S32). Thereafter, the address-shift setting pattern generated in Step S32 and a default test pattern already generated are merged to each other, so that a new address-shift setting pattern is added to the default test pattern (Step S33). In Step S33, a test pattern including a user condition is generated.

As described above, it is found that the memory BIST circuit 12 to be incorporated into a semiconductor device described in the above embodiments and a test pattern to be applied to the semiconductor device are automatically generated with a computer by causing a program to read various types of information indicating a desired test condition.

Here, an offset value calculation procedure in the above program is described in detail. This offset value calculation procedure is described, referring to FIGS. 21 and 22. FIGS. 21 and 22 are diagrams for explaining how to determine an offset value in the semiconductor device according to the fifth embodiment in detail. FIGS. 21 and 22 illustrate a flow sequence of the offset value calculation procedure.

First, FIG. 21 is referred to. When the offset value is calculated, first, the maximum memory space is defined on the basis of the X-direction maximum address and the Y-direction maximum address of memory arrays belonging to a group to be tested in one test sequence in such a manner that these maximum addresses fall within the maximum memory space, as illustrated in FIG. 21. Then, for the maximum memory space, a coefficient with a weight increasing as power required for every test timing becomes lower (hereinafter, referred to as a weight coefficient) is set on the basis of a power profile. This setting of the weight coefficient is not necessarily performed. In addition, power consumption for every memory array to be tested is acquired from memory data.

Subsequently, a first grouping process is performed. The first grouping process groups memory arrays to be tested in such a manner that the memory arrays to be tested are accommodated in the maximum memory space, while focusing on the X-direction size of the maximum memory space. In the example illustrated in FIG. 21, the X-direction size of a memory D is the same as that of the maximum memory space. Therefore, the memory D is grouped into a first group. Further, because there are the memories A and B as memories that can be arranged in a region that is a difference between the maximum memory space and the size of the memory D, these memories A and B are added to the first group. Then, the remaining memory C is grouped into a second group.

Subsequently, overlapping between the first group and the second group is adjusted. In the example illustrated in FIG. 21, the Y-direction size of the total of the memories A and D or the Y-direction size of the total of the memories B and D is the same as the Y-direction size of the maximum memory space. Further, the Y-direction size of the memory C is the same as the Y-direction size of the maximum memory space. Therefore, it is confirmed that the second group cannot be arranged by being shifted in the Y-direction with respect to the first group.

Subsequently, a second grouping process is performed. The second grouping process groups the memory arrays to be tested in such a manner that the memory arrays to be tested are accommodated in the maximum memory space, while focusing on the Y-direction size of the maximum memory space. In the example illustrated in FIG. 22, when the memories A, B, and C are arranged in the X-direction, the total of the X-direction sizes become the X-direction size of the maximum memory space. Therefore, the memories A, B, and C are grouped into a third group. Then, the remaining memory D is grouped into a fourth group.

Subsequently, overlapping between the third group and the fourth group is adjusted. In the example illustrated in FIG. 22, the total X-direction size of the memories A, B, and C is the same as the X-direction size of the maximum memory space. Further, the X-direction size of the memory D is the same as the X-direction size of the maximum memory space. From these facts, it is confirmed that the fourth group cannot be arranged by being shifted in the X-direction with respect to the third group.

Then, the memories A to D are arranged in the maximum memory space on the basis of the results of the first grouping process and the second grouping process. In the example illustrated at the bottom of FIG. 22, as a result of provisional arrangement of the memories A to D in the maximum memory space, there are cells that each provides a value over than 20 as a total value of power consumption of that cell and the weight coefficient. Therefore, the memory C is shifted in the X-direction to be overlapped on the memories A and D. When a total value of the power consumption of each cell and its weight coefficient is calculated after the memory C is moved, the maximum power consumption becomes smaller than before the memory C is moved. Therefore, in the example illustrated in FIG. 22, an offset value of each memory array is calculated to achieve the lower right memory arrangement in FIG. 22.

As described above, it is found that an address-shift setting pattern applied to the semiconductor device described in the first to fourth embodiments can be easily calculated by optimization calculation by a computer.

In the above, the invention made by the inventors of the present application has been specifically described by way of the embodiments. However, it is naturally understood that the present invention is not limited to the aforementioned embodiments, and can be changed in various ways within the scope not departing from the gist thereof.

(Appendix 1)

A test circuit generation program that causes to a test circuit to be built in a semiconductor device that includes a plurality of memory arrays having different number of memory cells arranged in a grid, a plurality of memory interface circuits each corresponding to one of the memory arrays and each activating the corresponding one of the memory cells based on an access address, and a memory test pattern generation circuit that generates a test address as the access address during a test of the memory arrays, includes: reading in a net list and clock information of the semiconductor device without the test circuit and a memory data including sizes and number of the memory arrays on the semiconductor device; generating a test circuit that includes an offset storage register provided to correspond to the memory array, an address shifter shifting the access address on the basis of an offset setting value stored in the offset storage register, and a selection circuit provided to correspond to the address shifter; and determining a configuration of a memory test pattern generation circuit on the basis of the net list, the clock information, the memory data, and information on the test circuit and generating memory BIST information indicating a configuration of the memory test pattern generation circuit and test circuit information indicating a condition for performing a test using the memory test pattern generation circuit and the test circuit.

(Appendix 2)

The test circuit generation program described in Appendix 1 performs an offset value calculation process that calculates an offset value adaptable to the test circuit to satisfy a transition condition of power consumption of the semiconductor device in a test operation in which an operation test of the memory arrays are performed in the semiconductor device, the transition condition being indicated by test condition information including the transition condition; rearrange the offset values calculated in the offset value calculation process in accordance with a register configuration indicated by the test circuit information to generate an address-shift setting pattern; generating MBIST pattern information indicating a test pattern generated by the memory test pattern generation circuit on the basis of the test circuit information; and merges the MBIST pattern information and the address-shift setting pattern to generate a test pattern.

(Appendix 3)

In the offset value calculation process, the test circuit generation program described in Appendix 2 generates a maximum memory space having a memory space capable of accommodating at least one of the memory arrays that has a maximum X-address space and one of the memory arrays that has a maximum Y-address space, performs a first grouping process that groups one or more of the memory arrays, which fall within a range of a maximum X-address of the maximum memory space when the memory arrays are arranged, into one group to classify all the memory arrays into a plurality of groups; performs a second grouping process that groups one or more of the memory arrays, which fall within a range of a maximum Y address of the maximum memory space when the memory arrays are arranged, into one group to classify all the memory arrays into a plurality of groups; calculates a shiftable amount for every memory array on the basis of the groups generated in the first grouping process and the second grouping process; overlaps the groups generated in the first grouping process or the second grouping process to calculate total power consumption for every test timing after overlapping; changes a position of overlapping the memory arrays, considering the shiftable amount, to allow the total power consumption to satisfy the transition condition of the power consumption indicated by the test condition information; and calculates the first offset value and the second offset value for every memory array in accordance with positions of the memory arrays on the maximum memory space after being changed.

(Appendix 4)

The test circuit generation program described in Appendix 1 is executed by a computer that includes an operation unit performing an operation, and a storage device that stores therein condition information used in the test circuit generation program and information output by the test circuit generation program.

What is claimed is:

1. A semiconductor device comprising:
a plurality of memory arrays that are different from each other in the number of memory cells arranged in a grid;
a plurality of memory interface circuits each corresponding to one of the memory arrays and each activating one of the memory cells on the basis of an access address; and
a memory test pattern generation circuit generating a test address as the access address during a test of the memory arrays,
wherein each of the memory interface circuits includes
a first address shifter converting a first X-address that is an X-direction address of the memory array to be tested in the test address to a second X-address that is an actual address of the memory array to be tested by address shifting,
a first offset storage register storing therein a first offset value that specifies a shift amount between the first X-address and the second X-address in the first address shifter,
a second address shifter converting a first Y-address that is a Y-direction address of the memory array to be tested in the test address to a second Y-address that is an actual address of the memory array to be tested by address shifting, and
a second offset storage register storing therein a second offset value that specifies a shift amount between the first Y-address and the second Y-address in the second address shifter, and
wherein the first offset storage register and the second offset storage register configure a portion of a shift register circuit to which shift amount data indicating the shift amount is supplied from outside.

2. The semiconductor device according to claim 1, further comprising:
a logic circuit outputting access addresses for the memory arrays to perform a process using the memory arrays; and
a test mode control circuit outputting a test mode control signal that switches a normal operation mode in which the memory arrays are used by the logic circuit and a test operation mode in which the memory arrays are tested,
wherein each of the memory interface circuits includes
a first selection circuit that selects either one of a third X-address that is an X-direction address of the memory array in the access address and the second X-address and outputs the selected one to a corresponding one of the memory arrays, and
a second selection circuit that selects either one of a third Y-address that is a Y-direction address of the memory array in the access address and the second Y-address and outputs the selected one to a corresponding one of the memory arrays, and
wherein the first selection circuit and the second selection circuit select the third X-address and the third Y-address, respectively, when the test mode control signal specifies the normal operation mode, and select the second X-address and the second Y-address, respectively, when the test mode control signal specifies the test operation mode.

3. The semiconductor device according to claim 1,
wherein the first address shifter outputs an address value having a value obtained by subtracting the first X-address from the first offset value, which becomes equal to or larger than 0, as the second X-address, and
wherein the second address shifter outputs an address value having a value obtained by subtracting the first Y-address from the second offset value, which becomes equal to or larger than 0, as the second Y-address.

4. The semiconductor device according to claim 1,
wherein the first offset storage register stores therein an offset value having an N-bit (N is an integer) size as the first offset value, where N is smaller than the number of bits of the first X-address,
wherein the first address shifter includes
a plurality of first exclusive OR circuits that calculate exclusive OR of respective values of N bits of the first offset value and respective values of upper N bits of the first X-address, and a first gate circuit outputting a value of the first X-address other than the upper N bits as the second X-address in response to all outputs of the first exclusive OR circuits becoming 1,
wherein the second offset storage register stores therein an offset value having an M-bit (M is an integer) size as the second offset value, where M is smaller than the number of bits of the first Y-address, and
wherein the second address shifter includes
a plurality of second exclusive OR circuits that calculate exclusive OR of respective values of M bits of the second offset value and respective values of upper M bits of the first Y-address, and
a second gate circuit outputting a value of the first Y-address other than the upper M bits as the second Y-address in response to all outputs of the second exclusive OR circuits becoming 1.

5. The semiconductor device according to claim 1, wherein each of the first offset storage register and the second offset storage register holds a predetermined resetting offset value in response to a reset signal, and sets the resetting offset value to an offset value output from itself in response to the reset signal becoming active.

6. The semiconductor device according to claim 1, further comprising a JTAG controller that sets the first offset value and the second offset value in the first offset storage register and the second offset storage register by a shift operation on the basis of an address-shift setting pattern supplied thereto from outside.

7. The semiconductor device according to claim 1, further comprising:
a non-volatile memory storing therein a test pattern including an address-shift setting pattern;
a JTAG controller that sets the first offset value and the second offset value in the first offset storage register and the second offset storage register by a shift operation on the basis of the address-shift setting pattern; and
a post controller transferring the address-shift setting pattern to the JTAG controller and providing an operation instruction to the JTAG controller.

8. The semiconductor device according to claim 1, further comprising:
a non-volatile memory storing therein a test pattern including an address-shift setting pattern;
a reset control circuit outputting a reset signal in response to reset of the semiconductor device; and
a post controller that supplies the address-shift setting pattern stored in the non-volatile memory to the first offset storage register and the second offset storage register in response to the reset signal, and supplies an instruction to the non-volatile memory, which causes the first and second offset registers to store therein the first offset value and the second offset value, respectively.

9. The semiconductor device according to claim 1, further comprising:
a non-volatile memory storing therein a test pattern including an address-shift setting pattern;
a reset control circuit outputting a reset signal in response to reset of the semiconductor device; and
a test mode control circuit that supplies the address-shift setting pattern stored in the non-volatile memory to the first offset storage register and the second offset storage register on the basis of an instruction from outside, and supplies an instruction to the non-volatile memory, which causes the first and second offset registers to store the first offset value and the second offset value, respectively.

10. A memory test method for a semiconductor device that includes a plurality of memory arrays that are different from each other in the number of memory cells arranged in a grid, a plurality of memory interface circuits each corresponding to one of the memory arrays and each activating one of the memory cells on the basis of an access address, and a memory test pattern generation circuit generating a test address as the access address during a test of the memory arrays, wherein the memory interface circuits each include a first offset storage register and a second offset register coupled in daisy-chain connection, the method comprising:
  supplying an address-shift setting pattern to the first offset storage register and the second offset storage register by a shift operation and storing a first offset value in the first offset storage register and a second offset value in the second offset storage register;
  shifting a first X-address that is an X-direction address of the memory array to be tested in the test address by a shift amount corresponding to the first offset value by address shifting to convert the first X-address to a second X-address;
  shifting a first Y-address that is a Y-direction address of the memory array to be tested in the test address by a shift amount corresponding to the second offset value by address shifting to convert the first Y-address to a second Y-address; and
  performing a test for the memory arrays by using the second X-address and the second Y-address.

11. The memory test method according to claim 10,
  wherein the first offset value is defined in such a manner that the second X-address is an address value equal to or smaller than an address value of the first X-address, and
  wherein the second offset value is defined in such a manner that the second Y-address is an address value equal to or smaller than an address value of the first Y-address.

12. The memory test method according to claim 10, wherein the first offset value and the second offset value are set for every memory interface circuit independently of other memory interface circuits.

13. A test pattern generation program for a semiconductor device that includes a plurality of memory arrays that are different from each other in the number of memory cells arranged in a grid, a plurality of memory interface circuits each corresponding to one of the memory arrays and each activating one of the memory cells on the basis of an access address, and a memory test pattern generation circuit generating a test address as the access address during a test of the memory arrays,
  wherein the memory interface circuits each include a first offset storage register and a second offset storage register coupled in daisy-chain connection,
  wherein an address-shift setting pattern is supplied to the first offset storage register and the second offset storage register by a shift operation, a first offset value is stored in in the first offset storage register, and a second offset value is stored in the second offset storage register,
  wherein a first X-address that is an X-direction address of the memory array to be tested in the test address is shifted by a shift amount corresponding to the first offset value by address shifting to be converted to a second X-address,
  wherein a first Y-address that is a Y-direction address of the memory array to be tested in the test address is shifted by a shift amount corresponding to the second offset value by address shifting to be converted to a second Y-address, and
  wherein a test for the memory arrays is performed by using the second X-address and the second Y-address, the program comprising:
  reading user condition information including a transition condition of power consumption of the semiconductor device during a test in which an operation test for the memory arrays is performed;
  reading memory BIST configuration information that is information on a circuit configuration of the memory test pattern generation circuit, memory data that is information on a memory size of each memory included in the memory arrays, and offset storage register information that is circuit configuration information of the first offset storage register and the second offset storage register;
  performing an offset value calculation process that calculates the first offset value and the second offset value by using the memory BIST configuration information and the memory data to satisfy the transition condition of power consumption indicated by the user condition information; and
  re-arranging the calculated first offset value and the calculated second offset value in accordance with a register configuration indicated by the offset storage register information to generate the address-shift setting pattern.

14. The test pattern generation program according to claim 13, wherein a new test pattern is generated by merging the address-shift setting pattern and a default test pattern including at least write data to be supplied to the memory arrays during a test.

15. The test pattern generation program according to claim 13, wherein in the offset value calculation process,
  a maximum memory space is generated which has a memory space capable of accommodating at least a memory array having a maximum X-address space among the memory arrays and a memory array having a maximum Y-address space among the memory arrays,
  a first grouping process is performed, which groups memory arrays that are able to be accommodated in a range of a maximum X-address of the maximum memory space when the memory arrays are arranged, into one group and which classifies all the memory arrays into a plurality of groups,
  a second grouping process is performed, which groups memory arrays that are able to be accommodated in a range of a maximum Y-address of the maximum memory space when the memory arrays are arranged, into one group and which classifies all the memory arrays into a plurality of groups,
  a shiftable amount for every memory array is calculated on the basis of the groups generated by the first grouping process and the second grouping process,
  the groups generated by the first grouping process or the second grouping process are overlapped, and total power consumption at every test timing after overlapping is calculated,
  a position of overlapping the memory arrays is changed considering the shiftable amount, in such a manner that the total power consumption satisfies the transition condition of power consumption indicated by the user condition information, and the first offset value and the second offset value for every memory array are calculated in accordance with a position of the memory array on the maximum memory space after being changed.

16. The test pattern generation program according to claim 13 executed by a computer that includes
an operation unit performing an operation, and
a storage device that stores therein the user condition information, the memory BIST configuration information, the memory data, and the offset storage register information, and also stores therein the address-shift setting pattern generated by the test pattern generation program.

* * * * *